United States Patent
Bult

(10) Patent No.: US 6,674,389 B2
(45) Date of Patent: Jan. 6, 2004

(54) CAPACITIVE FOLDING CIRCUIT FOR USE IN A FOLDING/INTERPOLATING ANALOG-TO-DIGITAL CONVERTER

(75) Inventor: Klaas Bult, Bosch En Duin (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/071,252

(22) Filed: Feb. 11, 2002

(65) Prior Publication Data

US 2002/0196172 A1 Dec. 26, 2002

Related U.S. Application Data

(60) Provisional application No. 60/267,686, filed on Feb. 9, 2001.

(51) Int. Cl.[7] .............................................. H03M 2/36
(52) U.S. Cl. ........................ 341/159; 341/155; 341/156; 341/158
(58) Field of Search ............................. 341/155, 156, 341/158, 159

(56) References Cited

U.S. PATENT DOCUMENTS

| | | | | |
|---|---|---|---|---|
| 4,640,163 A | * | 2/1987 | Douglas | 83/175 |
| 4,899,153 A | * | 2/1990 | Lewyn | 341/156 |
| 4,989,003 A | * | 1/1991 | Sauer | 341/136 |
| 5,291,198 A | * | 3/1994 | Dingwall et al. | 341/159 |
| 5,302,869 A | * | 4/1994 | Hosotani et al. | 327/75 |
| 5,677,621 A | | 10/1997 | Bult et al. | 323/315 |
| 5,757,303 A | * | 5/1998 | Nakatani et al. | 341/159 |
| 6,014,098 A | | 1/2000 | Bult et al. | 341/158 |
| 6,107,949 A | * | 8/2000 | Gross, Jr. | 341/159 |
| 6,169,510 B1 | | 1/2001 | Bult et al. | 341/155 |
| 6,175,323 B1 | * | 1/2001 | Flynn | 341/156 |
| 6,191,719 B1 | | 2/2001 | Bult et al. | 341/144 |
| 6,204,794 B1 | | 3/2001 | Bult | 341/155 |
| 6,285,865 B1 | | 9/2001 | Vorenkamp et al. | 455/307 |
| 6,480,134 B1 | * | 11/2002 | Sasaki | 341/159 |

OTHER PUBLICATIONS

Klaas Bult, "Analog Broadband Communication Circuits in Pure Digital Deep–Sub–Micron CMOS," *1999 IEEE International Solid–State Circuits Conference*.
Klaas Bult, "Analog Design in Deep Sub–Micron CMOS," *Broadcom Netherlands B.V.*, Sep. 20, 2000.
Yun Chiu et al., "A Study of Folding and Interpolating ADC," *EECS247, Fall 2000* Final Project Report, pp. 1 to 6.
Pierre Coulon, "S–38.220 Postgraduate Course on Signal Processing in Communications, Fall—99," Nov. 1, 1999, pp. 1–20.
M. Flynn et al., "FA 9.7: A 400MSample/s 6b CMOS Folding and Interpolating ADC," *IEEE 1998*, pp. 9.7–1 to 9.7–10.

(List continued on next page.)

Primary Examiner—Michael Tokar
Assistant Examiner—Khai Nguyen
(74) Attorney, Agent, or Firm—Sterne, Kessler, Goldstein & Fox, P.L.L.C.

(57) ABSTRACT

An M-bit folding/interpolating analog-to-digital converter (ADC) circuit, comprising a reference voltage generator, a converter, an interpolator, an amplifying stage, a comparator, and an encoder. The converter has an amplifier that receives at least one of a plurality of first reference voltage signals and outputs a plurality of coarse bits. The converter also has N-number of folding blocks, which output a plurality of folded signals. Each folding block comprises a plurality of capacitors, a differential amplifier and a feedback element. The folded signals output by the converter are then interpolated, amplified, compared and output as a plurality of fine bits. The encoder receives the coarse and fine bits and outputs the digital signal.

6 Claims, 28 Drawing Sheets

OTHER PUBLICATIONS

Jürgen Hertle, "High–Speed Folding and Interpolation A/D Converters," Workshop on A/D Converters for Telecommunication, *Integrated Systems Laboratory, ETH Zürich*, Oct. 22, 2001.

Hyung Hoon Kim et al., "A 12 Bit Current–Mode Folding/Interpolation CMOS A/D Converter With 2 Step Architecture," *Department of Electronic Engineering*, Inha University, Korea. (Unknown Date).

Alan Kwentus et al., "WA 19.1 A Single–Chip Universal Digital Satellite Receiver with 480MHz IF Input," *1999 IEEE International Solid–State Circuit Conference*.

Bradley A. Minch, "Folding the Differential Pair for Low–Voltage Applications," *Mixed Analog–Digital VLSI Circuits and Systems Laboratory (MAD VLSI)*, Cornell University. (Unknown Date).

Bram Nauta et al., "FA 16.3: A 70MSample/s 110mW 8b CMOS Folding Interpolating A/D Converter," *1995 IEEE International Solid State Circuits Conference*.

M. Steyaert et al., "A 100 MHz 8 bit CMOS Interpolating A/D Converter," *IEEE 1993 Custom Integrated Circuits Conference*, pp. 28.1.1 to 28.1.4.

Robert C. Taft et al., "A 100–MS/s 8–b CMOS Subranging ADC with Sustained Parametric Performance from 3.8 V Down to 2.2 V," *IEEE Journal of Solid–State Circuits*, vol. 36, No. 3, Mar., 2001.

John van Valburg et al., "An 8–b 650–MHz Folding ADC," *IEEE Journal of Solid–State Circuits*, vol. 27, No. 12, Dec., 1992, pp. 1662 to 1666.

Nauta, B. et al., "FA 16.3: A 70MSample/s 110mW 8b CMOS Folding Interpolating A/D Converter," XP000557639, IEEE International Solid State Circuits Conference, IEEE Inc., New York, US, Feb. 1, 1995, vol. 38, pp. 276–277, 379.

Van de Grift, Rob E.J., "An 8–Bit Video ADC Incorporating Folding and Interpolation Techniques," XP000560513, IEEE Journal of Solid–State Circuits, IEEE Inc., New York, US, Dec. 1, 1987, vol. 22, No. 6, pp. 944–953.

Nauta, B. et al., "A 70–MS/s 110–mW 8–b CMOS Folding and Interpolating A/D Converter," XP000557233, IEEE Journal of Solid–State Circuits, IEEE Inc., New York, US, Dec. 1, 1995, vol. 30, No. 12, pp. 1302–1308.

Van Valburg, J. et al., "An 8–b 650–MHz Folding ADC," XP000329014, IEEE Journal of Solid–State Circuits, IEEE Inc., New York, US, Dec. 1, 1992, vol. 27, No. 12, pp. 1662–1666.

\* cited by examiner

CAPACITIVE FOLDING CIRCUIT FOR USE IN A FOLDING/INTERPOLATING ANALOG-TO-DIGITAL CONVERTER

CROSS-REFERENCE TO RELATED APPLICATIONS

This application claims the benefit of U.S. Provisional Application No. 60/267,686, filed Feb. 9, 2001, which is incorporated herein by reference.

BACKGROUND OF THE INVENTION

1. Field of the Invention

The present invention is directed toward a M-bit folding/interpolating analog-to-digital converter circuit.

2. Related Art

In a conventional analog-to-digital converter, an analog signal is converted to a number of bits, typically between 4 bits and 10 bits. The exact number of bits in the digital word is determined by a number of factors, such as the accuracy and precision required, the cost of components, the required processing speed, available chip real-estate, and the like.

Various types of systems have been provided in the prior art for converting an input analog voltage to digital signals (currents or voltages) representative of such input analog voltage. One type of system, very often used in the prior art to provide such conversion, is known as a flash converter. In a flash converter, an analog input signal (representing the analog value to be converted digitally) is introduced to a first input of a differential amplifier in each of a plurality of repetitive cells. An individual one of a plurality of progressive fractions in a reference voltage is introduced to a second input of a respective differential amplifier.

The differential amplifier in each cell may have first and second branches each including a transistor such as MOS-FET transistor. The gates of the transistors in the first and second branches respectively receive the first and second inputs. The sources of the two transistors in each differential amplifier have a common connection to a source of a substantially constant current. Load bearing currents flow through the transistors in the branches in each differential amplifier in accordance with the relative values of the voltages on the gates of the transistors, the sum of these currents being the substantially constant current.

Thus, a first output, such as a binary "1", is produced in a comparator when the input voltage exceeds the particular fraction of the reference voltage introduced to the differential amplifier. Similarly, a second output, such as a binary "0", is produced in the comparator when the input voltage is less than the particular fraction of the reference voltage introduced to the differential amplifier.

The demand for low-power devices and the ever increasing operation frequencies in ADC calls for ADC designs with a reduced number of power consuming comparators. In a flash ADC a common technique is used to convert an analog input signal into an eight bit (8-b) digital output code. This structure normally requires a number of 255 comparators together with a set of 255 ($2^8-1$) reference voltages to define all the quantization levels of the ADC. If the input signal $V_{IN}$ exceeds the reference voltage of a comparator, the output of that comparator will be high. At the output of the comparator block, a linear code is present. The comparator block is the one who identifies the transition from high outputs to low outputs or vice-versa and establishes its dependency with the value of the input signal $V_{IN}$. A binary encoder, also integrating part of the ADCs structure, converts the 255-bit code into eight binary signals. Power consumption and chip area required for the implementation of a flash AD converter are practical limits at higher sampling rates.

Alternatively, in bipolar technology the folding and interpolation technique has proven to be successful for high sample rates. Several references investigate the possibilities of usage of this technique in CMOS. The major advantage of folding and interpolation lies in the field of high sample rate in combination with low power consumption and small chip area. The folding converter requires little power to drive the input, compared to other converters. For similar reasons the power consumption of the reference ladder of the folding converter can be kept low. Previously implemented 8 bit CMOS designs achieve 85Msample/s or even 100Msample/s. But these designs have corresponding power dissipations of more than 1 Watt (W), which is to much for the embedded applications.

Several attempts have been made to design high-speed folding/interpolating ADC that can be successfully used in embedded implementations of the VLSI integrated circuits. Given the fact that design and implementation requirements of highly integrated architectures are very strict, many of the known structures for this type of ADC can no longer be used. Especially, the implementation of the converter block raises several problems related with the power consumption, signal mis-matches and large chip space requirements.

Therefore, what is needed is a design that can achieve high-speed folding, a new circuitry and a new method that permit to achieve high sampling rates per second without the correspondent power consumption.

SUMMARY OF THE INVENTION

The present invention is directed to an folding/interpolating analog-to-digital converter (ADC) that achieves low power consumption. The folding block of the present invention requires a smaller chip area and allows higher sampling rates. The present invention achieves these benefits by using an N step folding structure, as part of configuration of M-bit folding/interpolation analog-to-digital converter circuit.

Moreover, the present invention is adapted to a cascaded structure comprising a plurality of individual N step folding structures to perform the folding, as part of the ADC's converter.

The present invention introduces an M-bit folding/interpolating analog-to-digital converter (ADC) circuit. The ADC comprises a reference voltage generator that outputs a plurality of first reference voltage signals based on an analog input signal. The ADC also comprises a converter having an amplifier that receives at least one signal from the plurality of first reference voltage signals and outputs a plurality of coarse bits. The M-bit folding/interpolating analog-to-digital converter (ADC) further comprises a number of N folding blocks, an interpolator that receives each of the folded signals form the folding blocks and outputs M times N number of interpolated outputs and a comparator. The comparator assigns one of a binary 1 and a binary 0 to each of the interpolated outputs, and outputs a binary 1 s towards the amplifier and a binary 0 as fine bits to an encoder, or outputs the binary 0 s to the amplifier and the binary is as fine bits to the encoder. The encoder receives the coarse bits and the fine bits and outputs M number of bits. M equals the sum of the coarse bits and the fine bits. Each folding block comprises a plurality of capacitors, an amplifier and a feedback element. Each capacitor has a first lead coupled to one of the plurality of first reference voltage signals. The differential amplifier has a first differential input coupled to a second lead of each of plurality of capacitors, a second differential input coupled to a second reference voltage. First and second differential outputs that output a folded signal. The feedback element has a first feedback lead coupled to at least one of first and second differential outputs and a second feedback lead coupled to first differential amplifier input.

The folding blocks of the M-bit folding/interpolating analog-to-digital converter can be implemented using switched capacitors. The folding blocks can be implemented using a plurality of equal value capacitance capacitors. The feedback element used to implement the folding blocks can be a capacitor. The value of its capacitance is X times the individual capacitance of each capacitor (said capacitor having like values). According to another embodiment of the present invention the feedback element is a field effect transistor, that performs integrating and filtering functions. According to another embodiment of the present invention a supplementary capacitor is introduced, having a first lead coupled to the second lead of each of the input capacitors and a second lead coupled to the first differential input of the differential amplifier. According to another embodiment of the present invention the folding blocks of the M-bit folding/interpolating analog-to-digital converter circuit can be implemented using a cascaded folding structure. The cascaded folding structure is implemented using a plurality of primary capacitive folding structures that output a primary folded signal. The signal constitutes input signal for a secondary folding structure constituted by a plurality secondary capacitive folding circuits that output a multiple folded signal.

In one embodiment of the invention, the output of each cell in an ADC converter is dependent upon the relative values of an analog input voltage and on each individual progressive fractions of a reference voltage signal introduced in a differential amplifier. To minimize output errors from cell mismatches, a first and second set of averaging impedances, preferably resistors, are respectively connected between the output terminals in the first branches and the output terminals in the second branches in successive pairs of cells. The impedances have relatively low values, particularly compared to the impedances of the current sources connected to the branch output terminals.

First and second resistive strips on the chip can be tapped in progressive positions to respectively define the impedances in the first and second sets. One end of each strip can be connected to the opposite end of the other strip to define a closed impedance loop for minimizing averaging errors at the strip ends. Different fractions of the reference voltage are generated based on an analog input signal associated with each individual impedance in the first and second sets. Such reference voltage fractions associated with each individual impedance have a particular repetitive relationship. In this way, the number of output terminals and cell mismatches are reduced. The different outputs at each individual impedance are determined for the progressive fractions of the reference voltage at such impedance. Successive voltage fractions for each impedance have opposite polarities to provide a folding relationship. Such outputs can be cascaded to further reduce cell mismatches and the number of output terminals.

The foregoing and other features and advantages of the present invention will be apparent from the following more particular description of the preferred embodiments of the invention, as illustrated in the accompanying drawings.

BRIEF DESCRIPTION OF THE FIGURES

The present invention is described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE INVENTION

Figure 1:
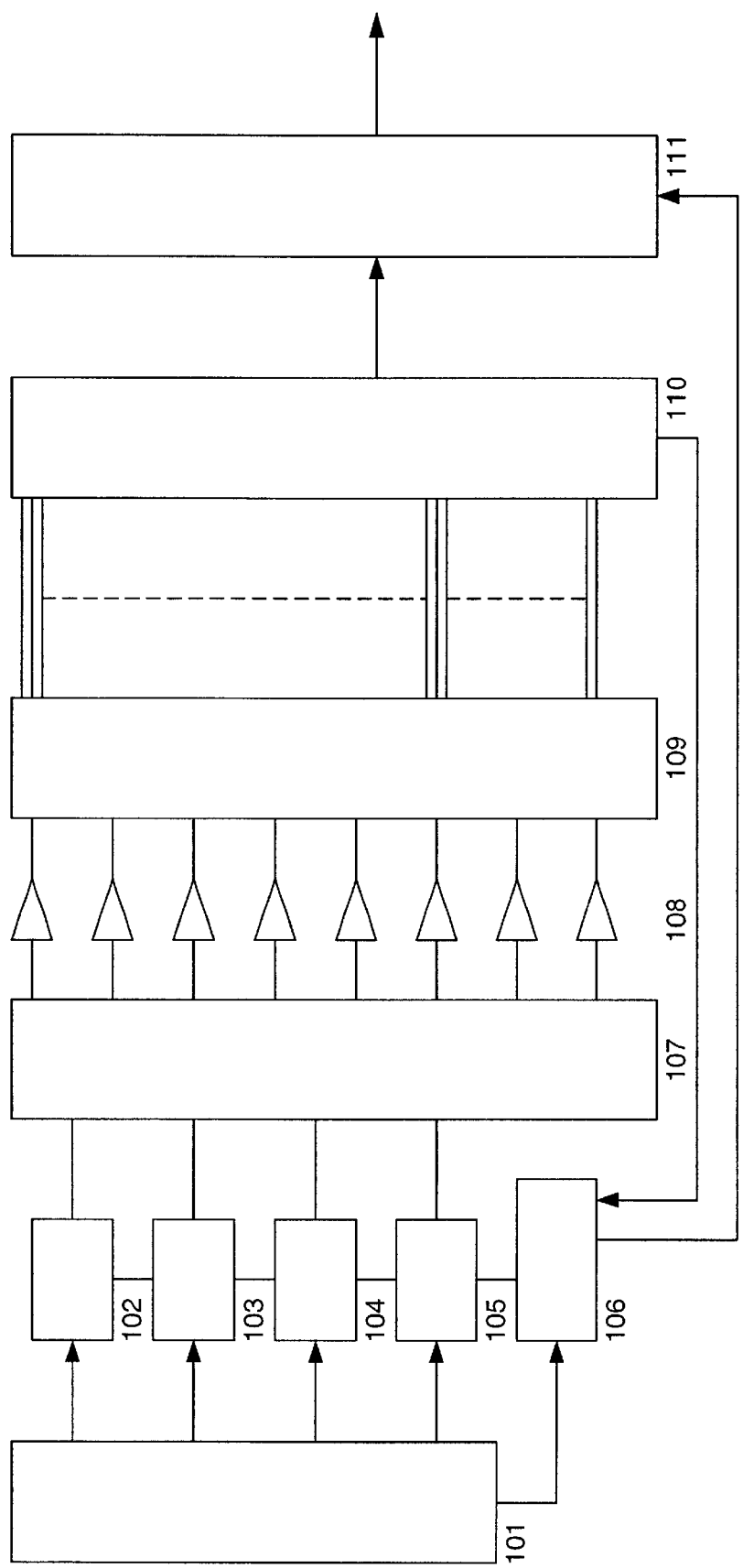
FIG. 1 illustrates a block diagram of an M-bit folding/interpolating ADC.

FIG. 1 shows a conventional architecture for an eight bit (8 bit) folding interpolating analog-to-digital (ADC) circuit (100). The circuit 100 comprises a reference voltage source (101) operatively connected to a converter block. The converter block is formed by a plurality of folding blocks (102, 103, 104, 105) and a coarse converter. The coarse converter is operatively connected with an encoder block (111). The outputs of the folding blocks constitute inputs for a two times resistive interpolating block. The plurality of interpolated signals are introduced in a block of 8 voltage amplifiers (108). The amplified signal constitutes input signal for a four times interpolation resistor network (109). The further interpolated signal is fed into a block of 32 comparators (110). The encoder block (111) receives the converted signal from the 106 block and the compared signal from 110 and outputs a digital signal.

Figure 2:
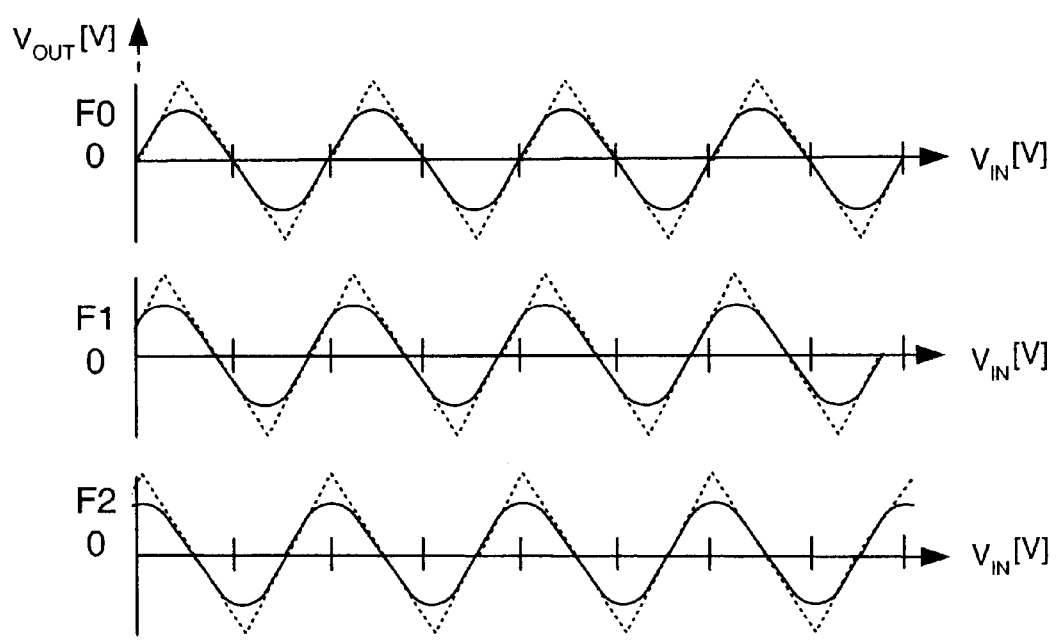
FIG. 2 illustrates three folded current signals emerging from corresponding folding blocks.

The aim of an 8 times folding technique is to pre-process the analog input signal so that one comparator is used for 8 different input signal levels instead of only one, like in a full flash architecture. Therefore, the coarse part has to consist of 3 bit to decide which of the 8 possibilities is valid. Four folding blocks 102, 103, 104, 105 generate three folding signals F0–F2, as shown in FIG. 2.

Folding blocks can be implemented using a basic structure called a "coupled differential pair" (CDP). FIGS. 3–19 show the implementation of this CDP cell, its characteristics and a classical way of associating these basic CDPs in order to form a folding block. The inputs of these CDPs are connected to the input signal and the reference ladder. A differential signal output by tree CDP is shown in FIG. 2. Since several CDPs are connected to the nodes in the folding block (see 102, 103, 104, 105 in FIG. 1) the parasitic capacitance at these nodes is very large. Furthermore the output signal has a much higher frequency than the analog input signal, inherent to the folding operation. Therefore, a trans-impedance amplifier is added to minimize the voltage swing across the nodes and eliminate the large parasitic capacitances of these nodes. The tree folded signals are designed to have different offsets with respect to the input signal. Especially at high frequencies, the peaks of the folding signals are distorted. However, one of the tree signals is always in its linear region around a zero crossing. With 32 folding signals instead of four, only the zero crossing itself is of interest, even more distortion in the peaks of the 32 folding signals being acceptable. The lacking 28 signals are generated by resistive interpolation. A first resistive interpolator (107) generates four additional signals from F0–F3, and the resulting 8 folding signals are fed into voltage amplifiers (108) for 8 times amplification. After the amplification, another four times interpolation resistor network (109) generates 32 folding signals that are fed into a block of 32 comparators (110), which detect the zero crossings of the 32 folding signals. The outputs of the 32 comparators are fed into digital encoding block (111) which generates the 5 fine bits.

An actual implementation of the circuit depicted in FIG. 1 has to be fully differential to achieve immunity for substrate noise and crosstalk. This allows embedded applications of the converter in large integrated systems. In the folding blocks (102, 103, 104, 105) the transistors have large gate areas and thus the offsets are small.

The output of each cell in an ADC is dependent upon the relative values of an analog input voltage and on each individual progressive fractions of a reference voltage, respectively, introduced in a differential amplifier. To minimize output errors from cell mismatches, a first and second set of averaging impedances, preferably resistors or capacitors, are respectively connected between the output terminals in the first branches, and the output terminals in the second branches, in successive pairs of cells. The impedances have relatively low values, particularly compared to the impedances of the current sources, connected to the branch output terminals.

An exemplary way to implement the resistive networks is using first and second resistive strips on the chip, which are tapped in progressive positions to respectively define the impedances in the first and second sets. One end of each strip may be connected to the opposite end of the other strip to define a closed impedance loop for minimizing averaging errors at the strip ends. Different fractions of the reference voltage are associated with each individual impedance in the first and second sets. Such reference voltage fractions associated with each individual impedance have a particular repetitive relationship. In this way, the number of output terminals and cell mismatches are reduced. The different outputs at each individual impedance are determined for the progressive fractions of the reference voltage at such impedance. Successive voltage fractions for each impedance have opposite polarities to provide a folding relationship. Such outputs may be cascaded to further reduce cell mismatches and the number of output terminals, as would be apparent to a person skilled in the relevant art.

Another known structure for folding ADC's includes a two-step structure, that reduces drastically the number of comparators. First, a coarse conversion is made, by using a 3-b flash ADCs. This converted signal is converted back to an analog value, using a digital-to-analog converter (DAC), and subtracted from the originally applied input signal. The residual signal is then converted into 32 levels using a 5-b flash AD converter. The analog signal to be converted is held at a constant value by a sample-and-hold amplifier (S/H). In this case, the number of comparators can be reduced from 255 to 38, which means reducing the power consumption as well as, chip area. The two extra blocks, the DAC and S/H, have to be designed for the intended sampling frequencies. The DAC must have a linearity of at least 8-b to avoid performance limitations and the S/H should have very small settling and aperture times.

In this case, a folding structure can reduce the number of comparators using analog preprocessing on the input signal $V_{IN}$. Fine and coarse information can be generated independently of each other, so this structure does not require a S/H and a DAC.

As noted above the differential pair is the basic element for a comparator in a flash AD converter. A total of 255 pairs are required to define all the code transitions. If a two-step structure for the ADC is preferred, in the analog pre-processor, the key element is a coupled differential pair (CDP).

Figure 3A:
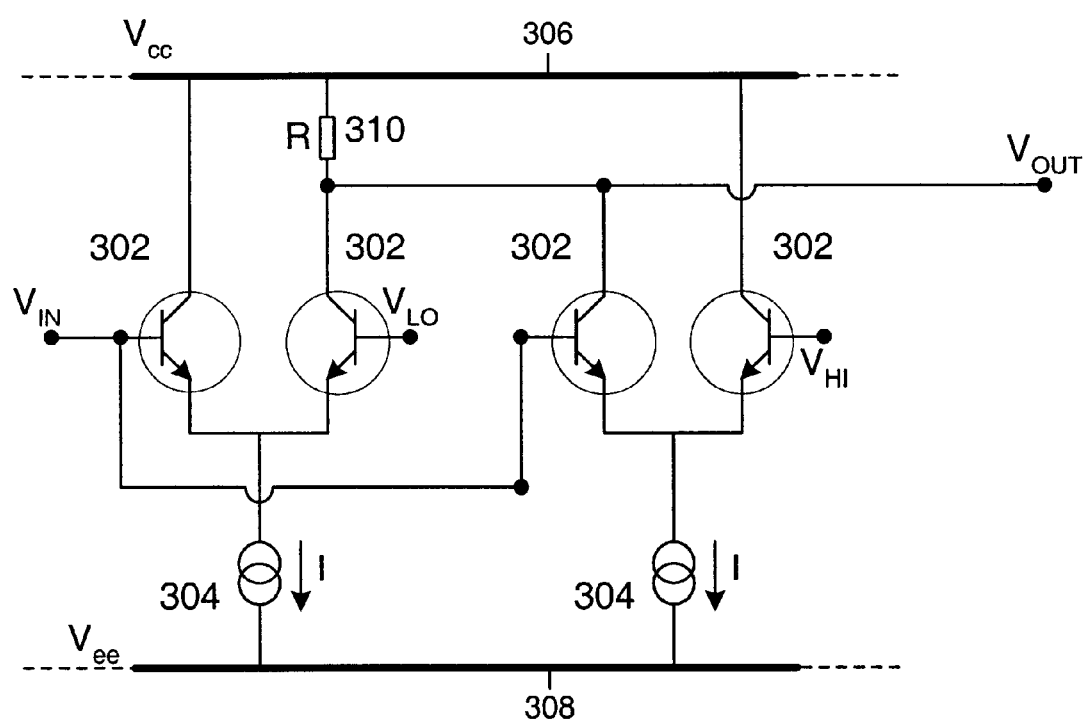
FIG. 3A illustrates a coupled differential pair.
Figure 3B:
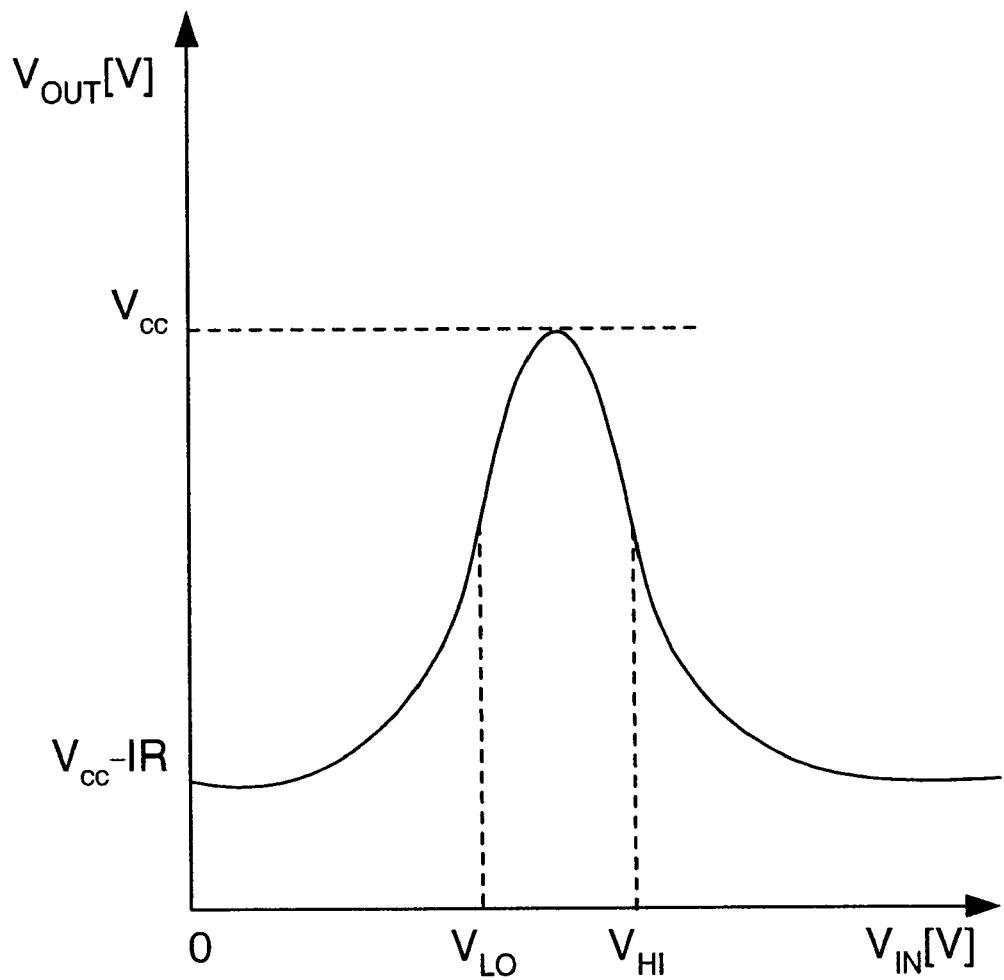
FIG. 3B illustrates the dc behavior of the coupled differential pair of FIG. 3A.

FIG. 3A shows the coupled differential pair, implemented using digital technology. Four CMOS transistors (302), each having a gate, source and drain are differentially connected in a conventional manner. Additionally, two current sources (304) are included, each exciting with constant current the common line that unites the drains of the transistors, as uniting branches of the output terminals. Two reference voltage lines, responsible for maintaining the gate—drain voltage gradient, $V_{cc}$ and $V_{ee}$, are also present. FIG. 3B shows the dc behavior of a CDP, where the output $V_{OUT}$ is high, if $V_{LO} < V_{IN} < V_{HI}$.

Figure 4:
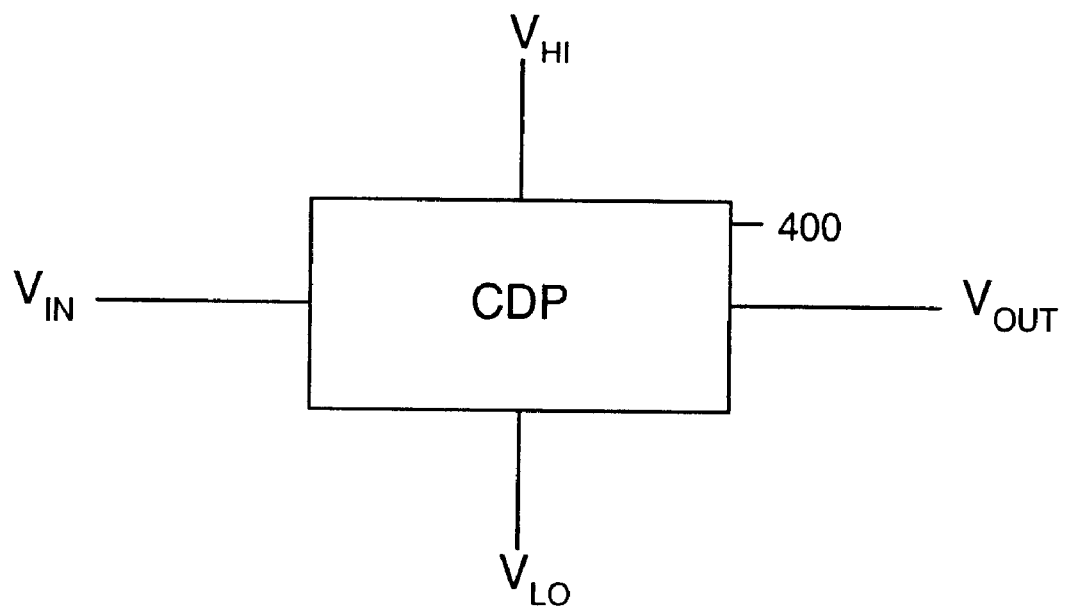
FIG. 4 illustrates a block diagram of a coupled differential pair.

FIG. 4 shows a block diagram of a CDP, the coupled differential pair, with its input and output terminals. This is the basic cell, which is used further on, to show how the implementation of all structures with differential outputs, integrated in the converter, part of the analog to digital converter, has been made in the prior art. This basic cell has two inputs ($V_{IN}$ and $V_{LO}$) and two outputs ($V_{HI}$ and $V_{OUT}$). $V_{IN}$ is the input signal, $V_{OUT}$ is the output signal, $V_{LO}$ and $V_{HI}$ are to voltage reference levels.

Figure 5:
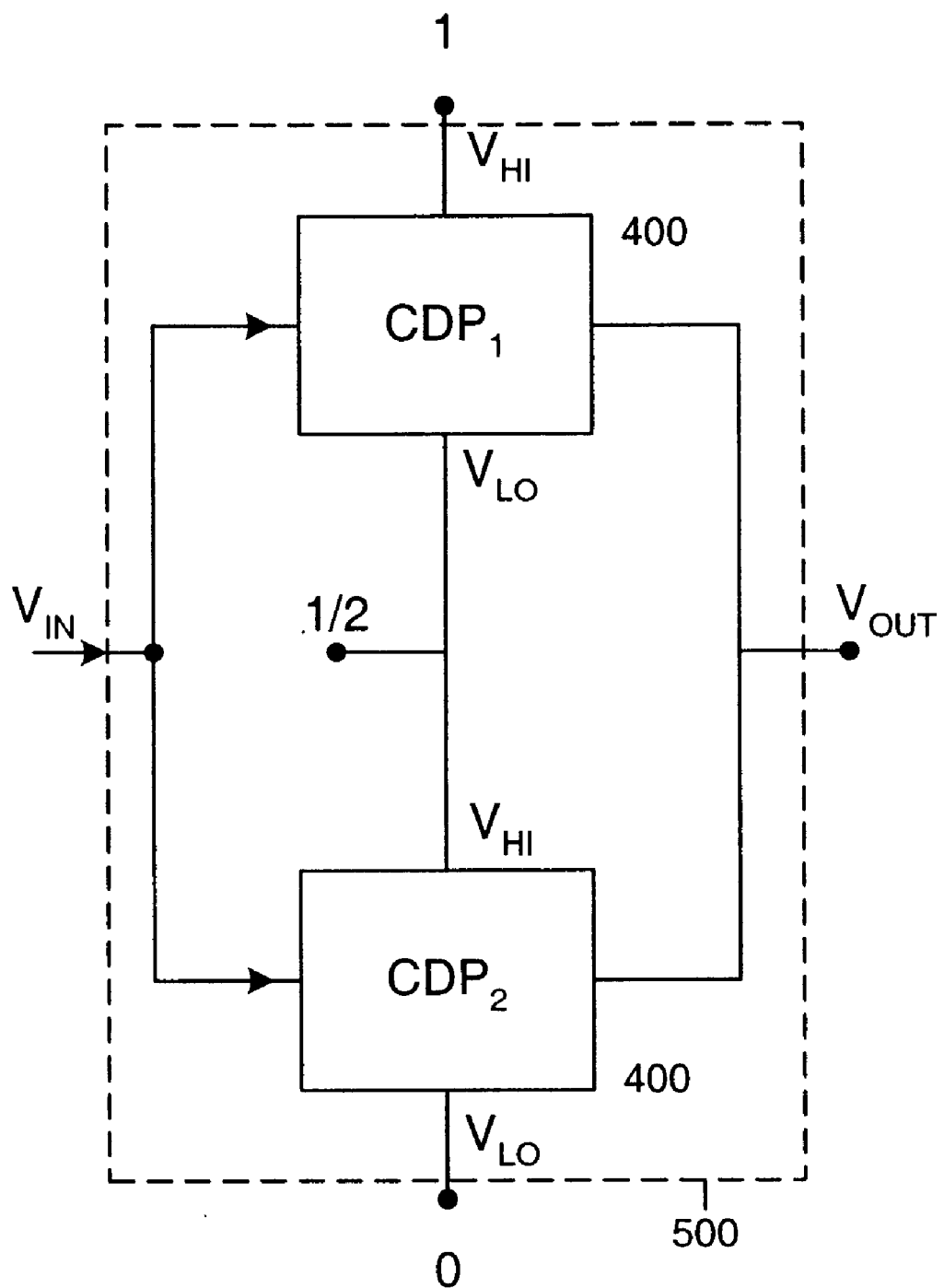
FIG. 5 illustrates a differential output of an one-bit (1-b) analog-to-digital converter, implemented with a pair of coupled differential pairs.

FIG. 5 is a representation of an arrangement of two CDP's, used to implement the differential output of an one bit (1-b) ADC. The lower CDPs generates a high $V_{OUT}$ output, if $0<V_{IN}<0.5$, assuming that the input range voltage is 0 to 1V (for example). This output is defined as the inverted version of the most significant bit (MSB). The upper CDP (CDP$_1$) generates the most significant bit (MSB) and generates $V_{OUT}$ if $0.5<V_{IN}<1.0$.

Figure 6A:
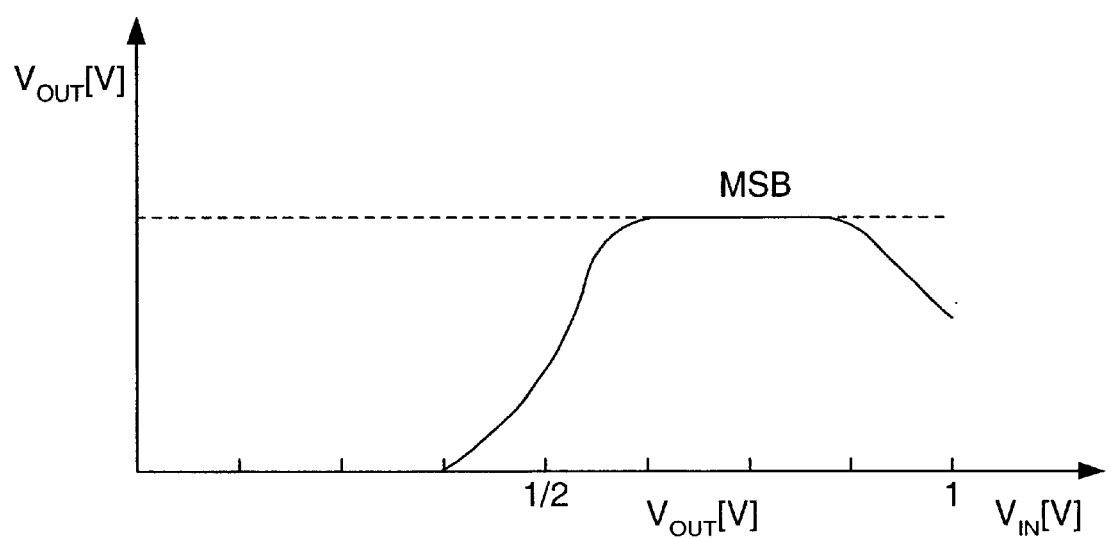
FIG. 6 illustrates the dc behavior of the coupled differential pairs that compose the differential output of the 1-b analog-to-digital converter of FIG. 5.
Figure 6B:
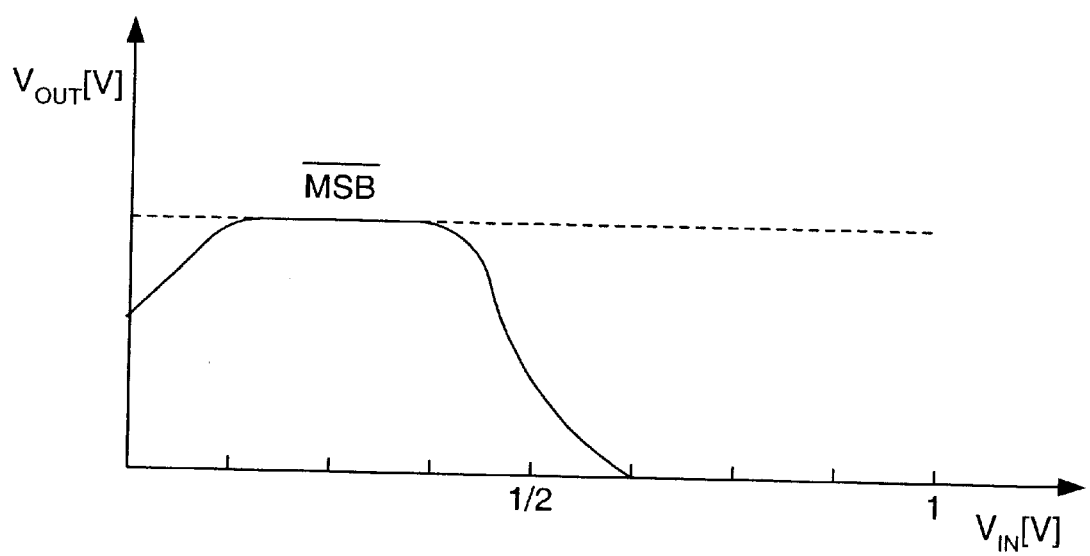

FIGS. 6A and 6B represent the dc behavior of each CDP of the 1-b analog-to-digital converter in FIG. 5. The MSB being produced by the CDP$_1$ corresponds to a voltage range of 0.5 to 1V. Its inverted version ($\overline{MSB}$) corresponds to a voltage range of 0 to 0.5 V produced by CDP$_2$.

Figure 7:
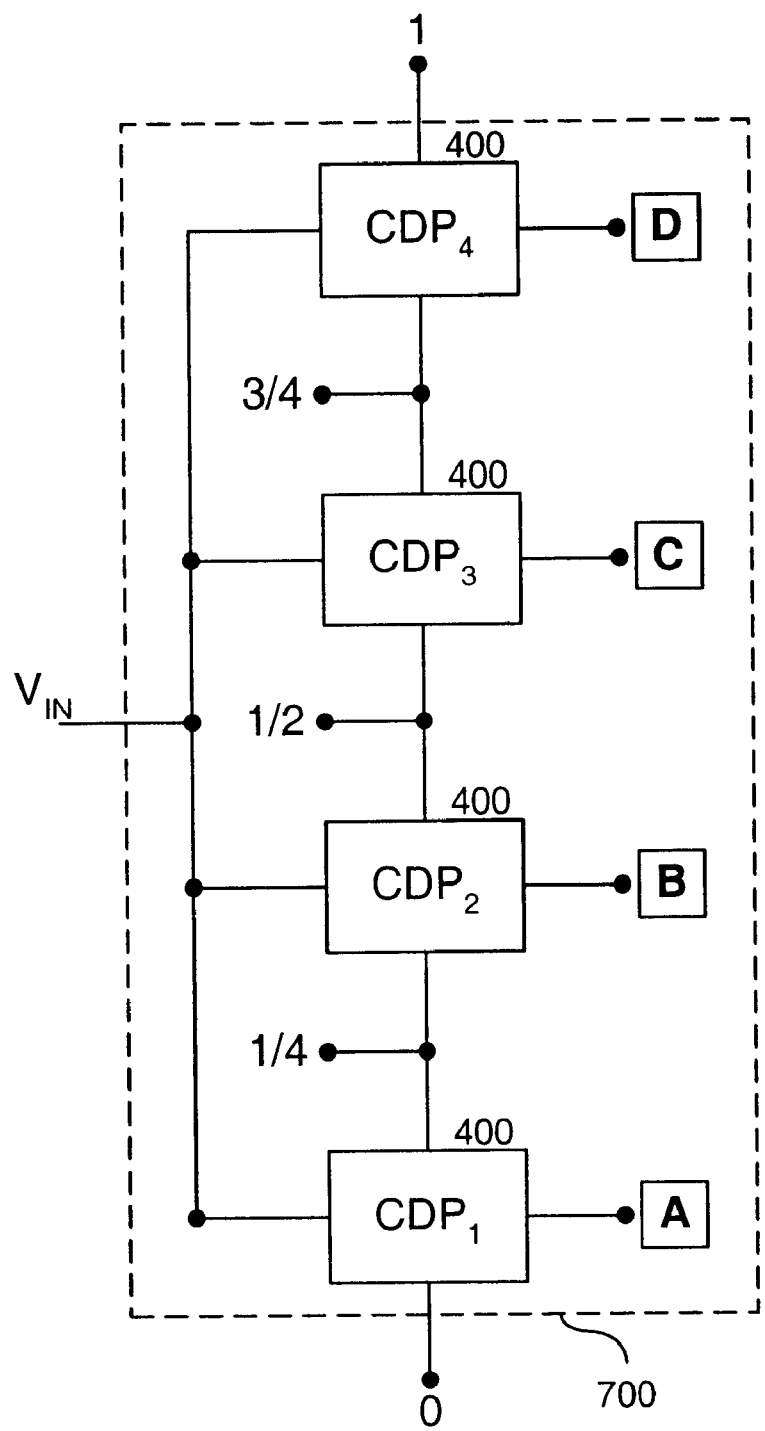
FIG. 7 illustrates a differential output of an two-bit (2-b) analog-to-digital converter, implemented with four coupled differential pairs.

An integrated device with four CDP's can be configured in a similar way. It generates signals that allow to implement a two bit (2-b) AD converter. FIG. 7 illustrates a structure (700) of interconnected four identical CPD's, supplied from the same voltage input node and having A, B, C, D as corresponding outputs.

Figure 8:
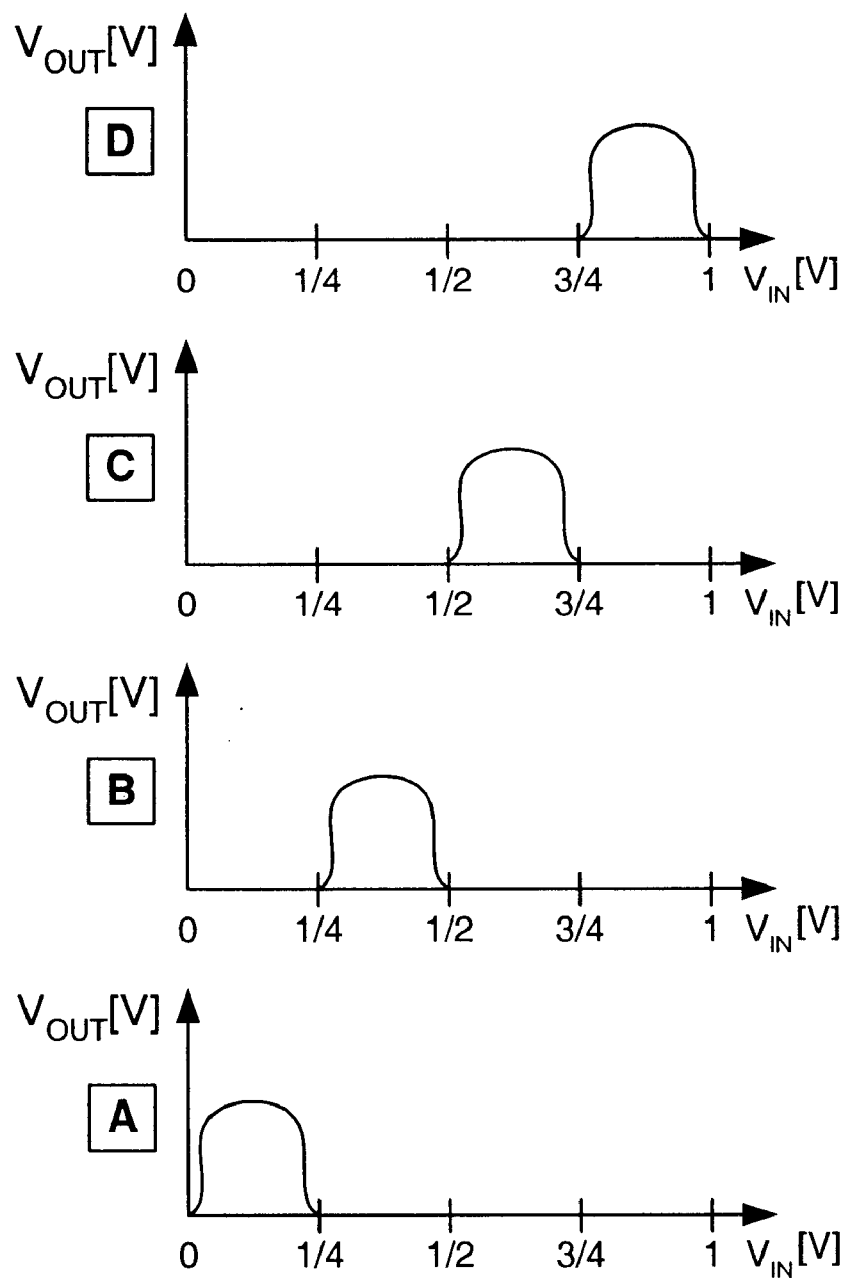
FIG. 8 illustrates the dc behavior of each coupled differential pair that comprise the differential output of the 2-b analog to digital converter of FIG. 7.

FIG. 8 shows that each of the four outputs has a unique active region of 250 mV (for example), if the voltage input $V_{IN}$ ranges between 0 and 1V. The sum of each voltage output adds up to the complete range value.

Figure 9:
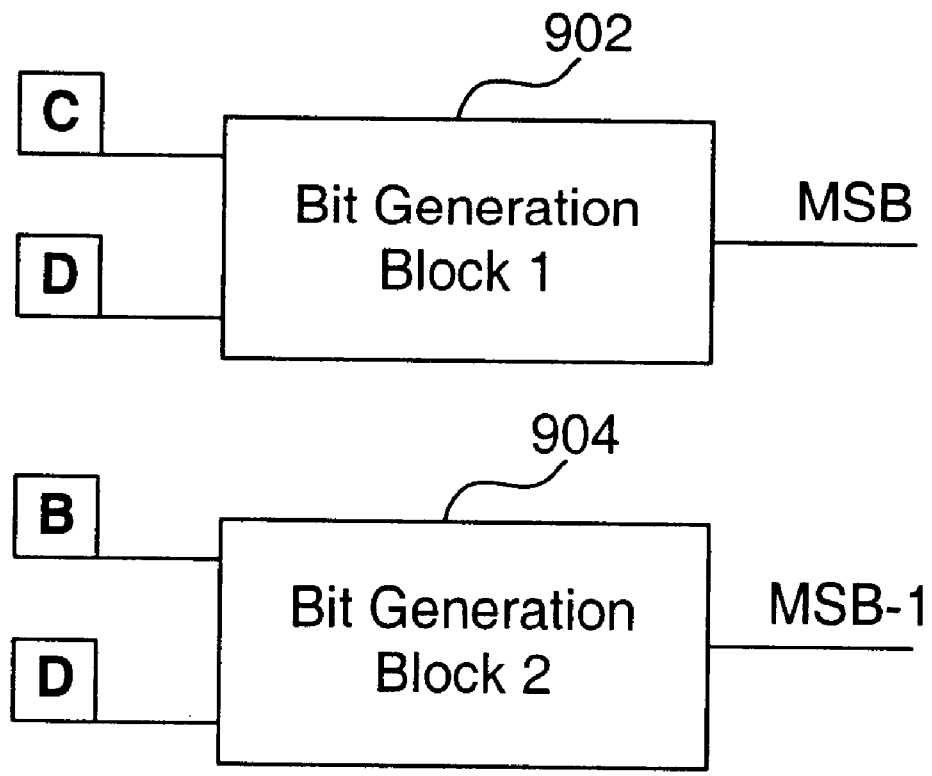
FIG. 9 illustrates combining blocks used to generate the most significant bits a 2-b analog-to-digital converter.

FIG. 9 represents two bit generation blocks, 902 and 904, respectively. The combination of outputs C and D defines the MSB, and the combination of outputs B and D defines the MSB-1. Similar combinations can be made to generate the inverted versions of the MSB and MSB-1.

Figure 10:
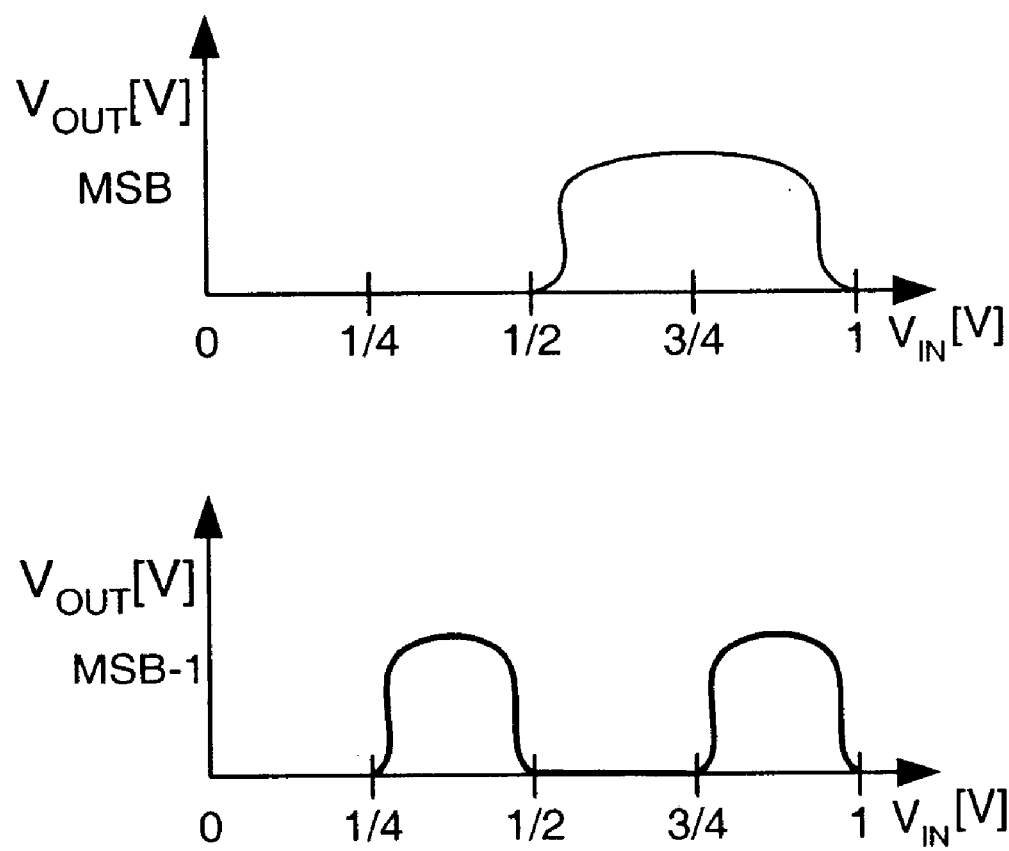
FIG. 10 illustrates the dc behavior of each block illustrated in FIG. 9.

FIG. 10 represents the dc behavior of the bit generation blocks outputs, emphasizing the MSB and MSB-1 of FIG. 9.

Figure 11:
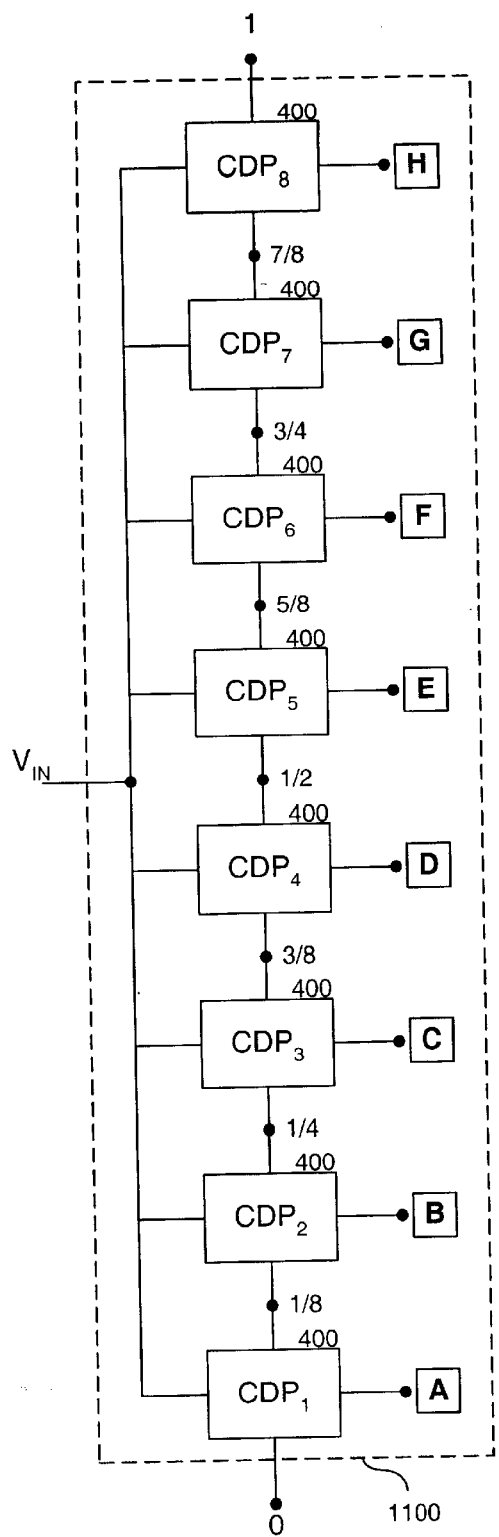
FIG. 11 illustrates a differential output of a tree-bit (3-b) analog to digital converter, implemented with eight CDP.
Figure 12:
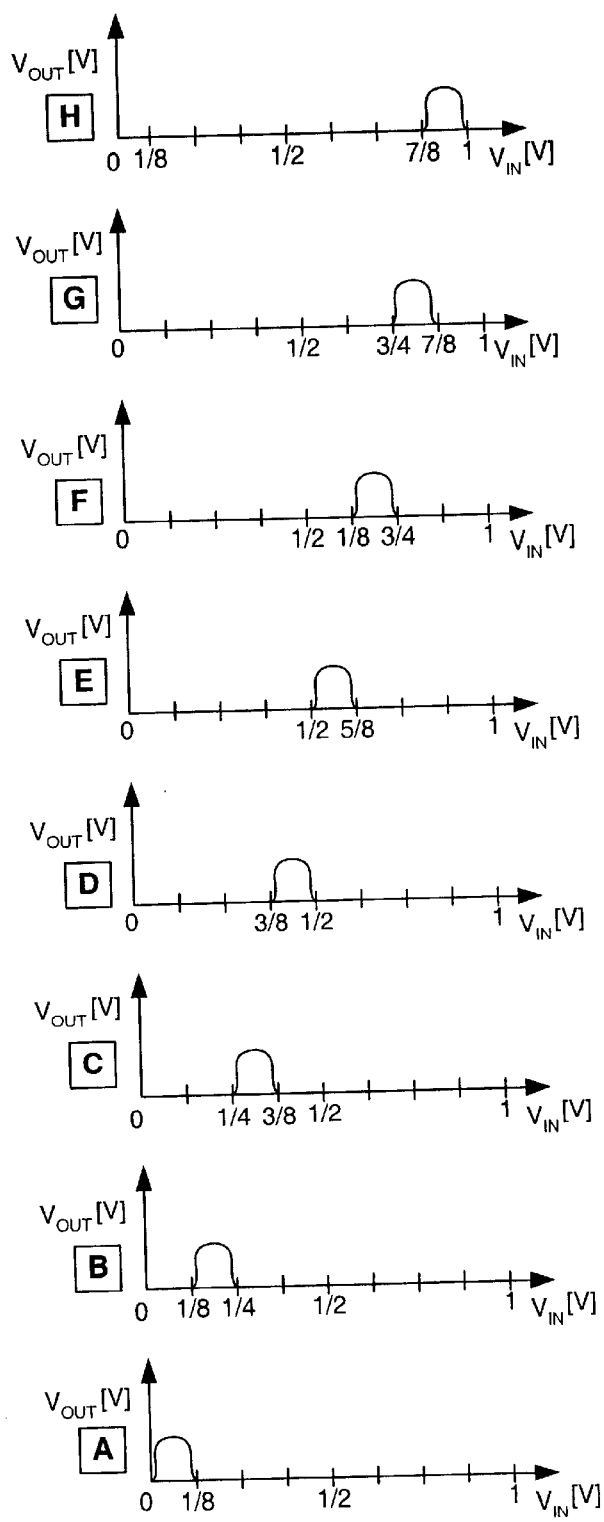
FIG. 12 illustrates the dc behavior of each CDP that comprise the 3-b analog to digital converter of FIG. 11.
Figure 13:
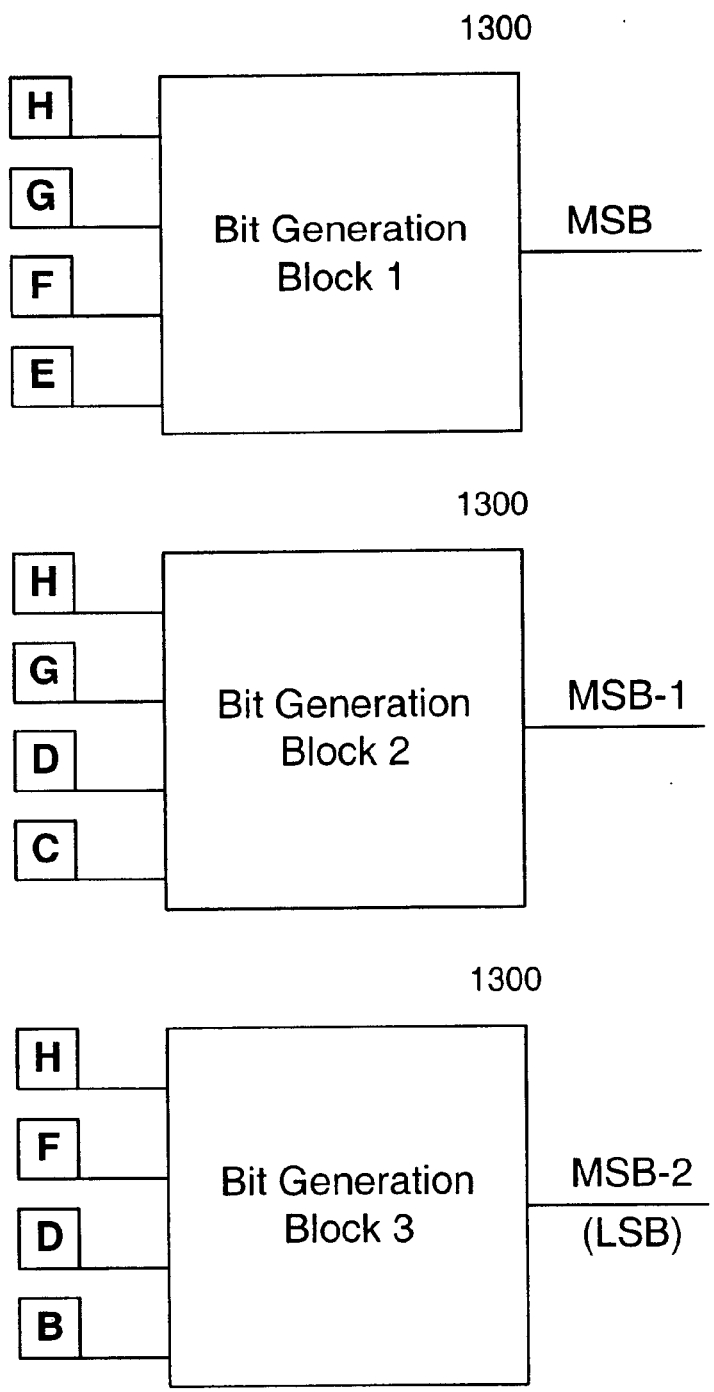
FIG. 13 illustrates the combining blocks used to generate the most significant bits of the 3-b analog-to-digital converter.
Figure 14:
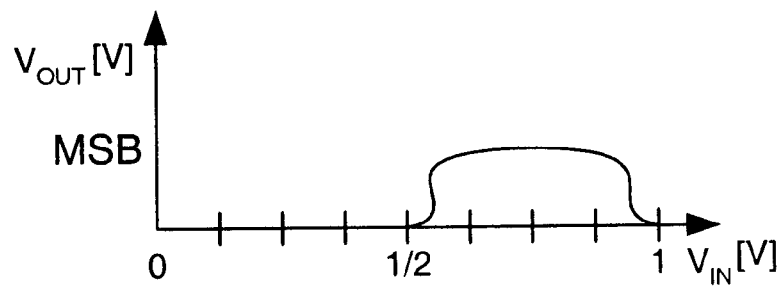
FIG. 14 illustrates the dc behavior of each block illustrated in FIG. 13.
Figure 14:
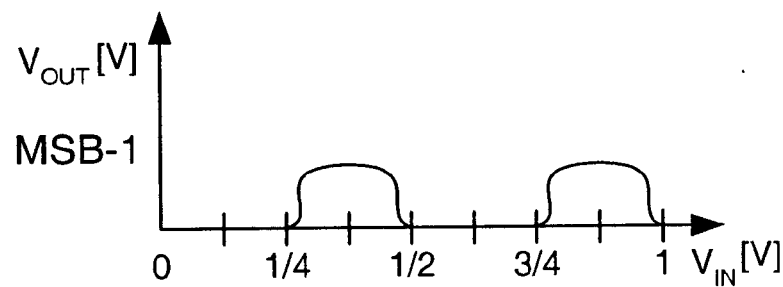
Figure 14:
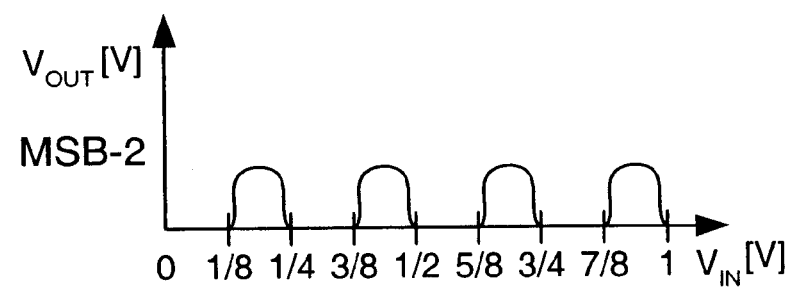
Figure 15:
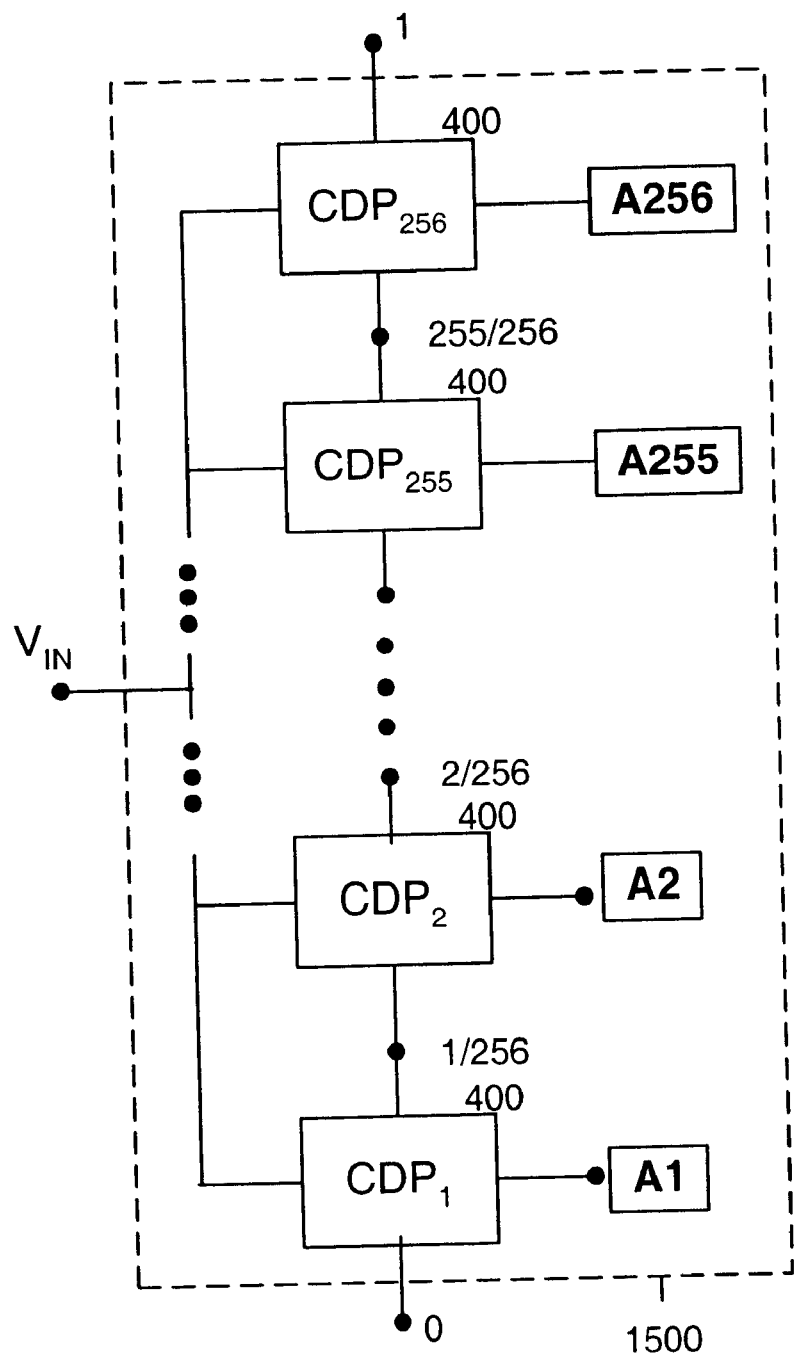
FIG. 15 illustrates a differential output of an eight-bit (8-b) analog to digital converter, implemented with 256 coupled differential pairs.
Figure 16:
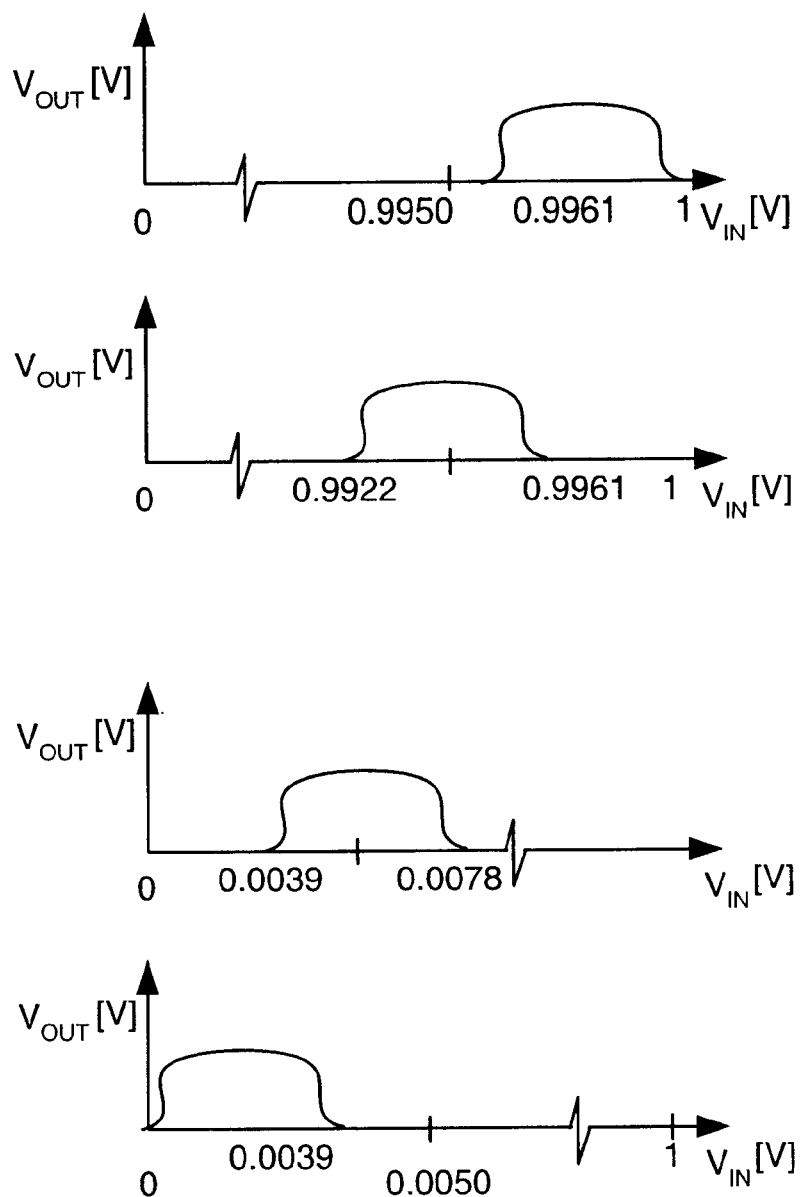
FIG. 16 illustrates the dc behavior of each coupled differential pair that comprise the 8-b analog to digital converter of FIG. 15.
Figure 17:
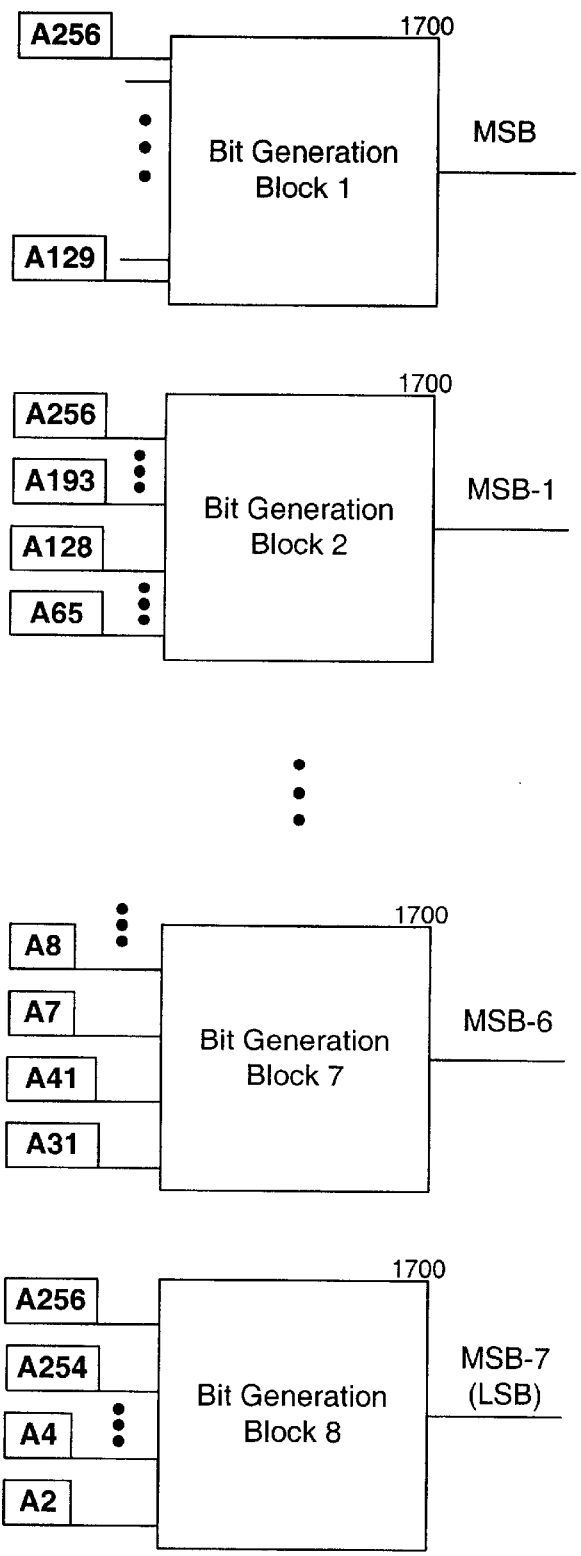
FIG. 17 illustrates the combining blocks used to generate the most significant bits of the 8-b analog to digital converter of FIG. 15.
Figure 18:
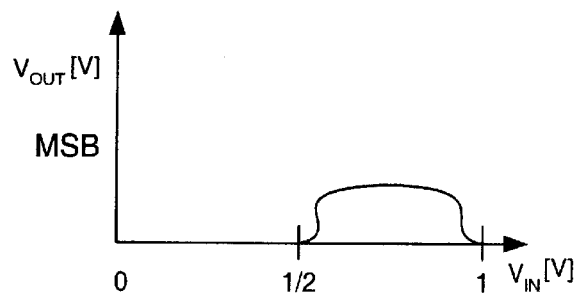
FIG. 18 illustrates the dc behavior of each block illustrated in FIG. 17.
Figure 18:
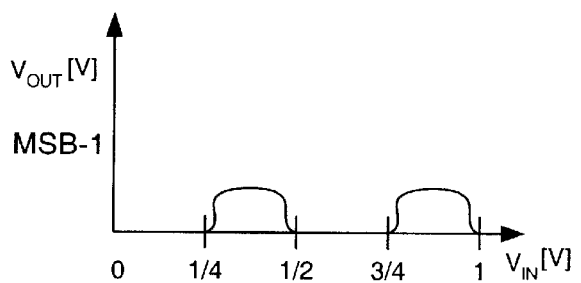
Figure 18:
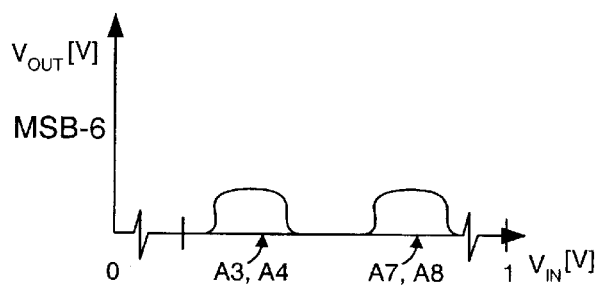
Figure 18:
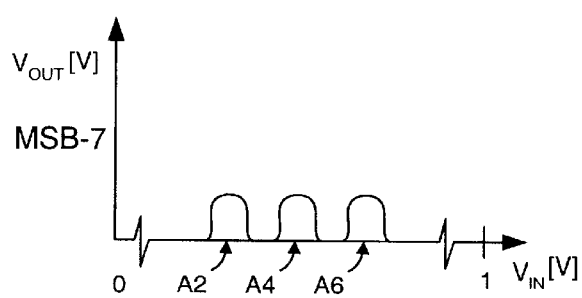
Figure 19:
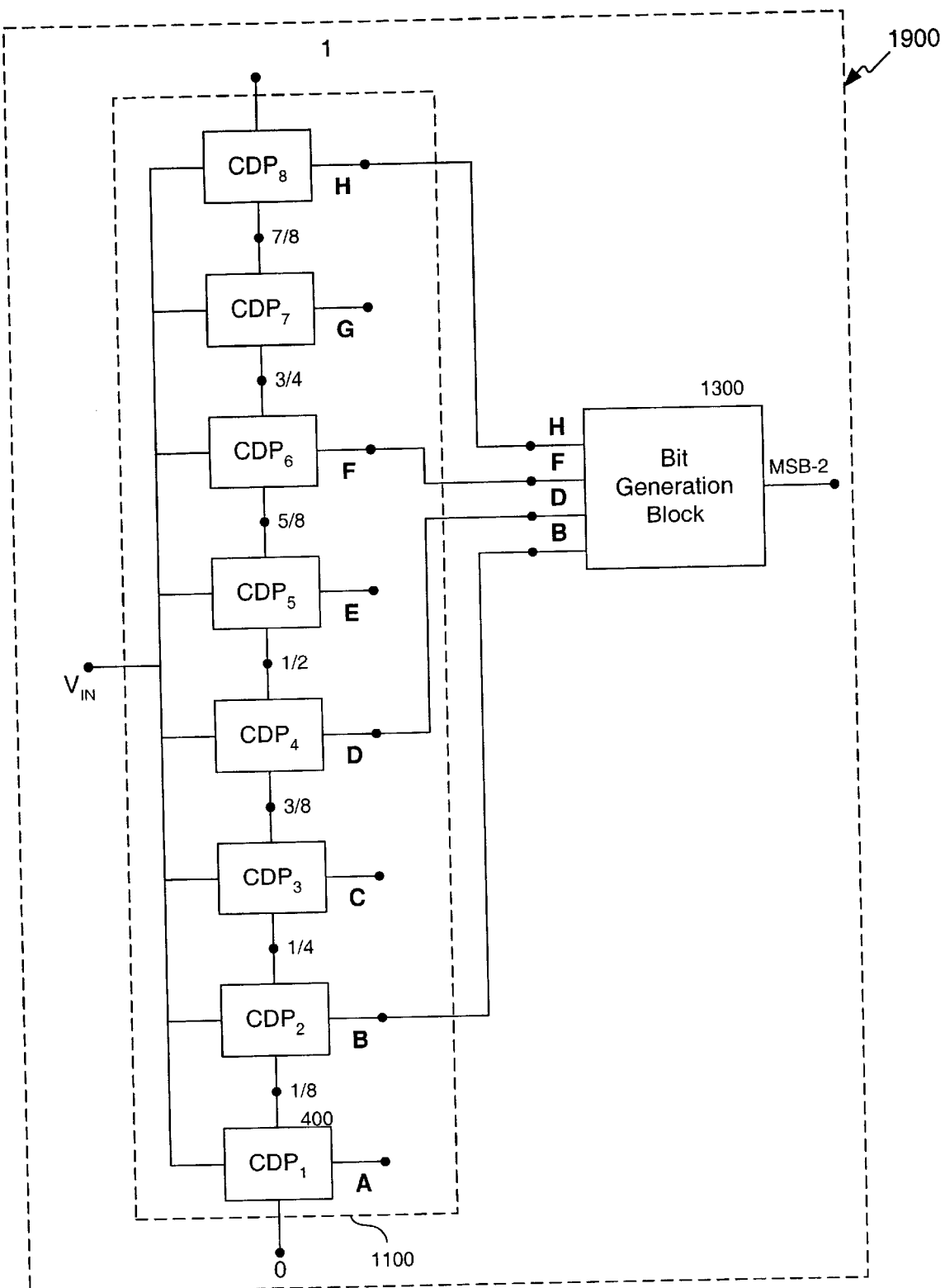
FIG. 19 illustrates a folding block implemented with 8 CDPs and a bit generation block.

A tree bit analog-to-digital converter (3-b ADC) can be implemented using eight CDP's, with reference steps of 125 mV (for example). FIG. 11 illustrates a differential output of an tree-bit (3-b) analog to digital converter (1100), implemented with eight CDPs. Combination blocks, similar to those showed in FIG. 9, are used to generate the MSB, MSB-1, and MSB-2. The corresponding signal shape for each output, respectively A, B, C, D, E, F, H, is illustrated by FIG. 12. The differential combination for generating MSB-2, MSB-1, MSB are shown in FIG. 13. FIG. 14 illustrates a dc voltage diagram corresponding to the output bits of FIG. 13.

A set of eight CDP's, together with the combination block that defines MSB-2, is called a folding block (FB). Resolution can be increased by using more than eight CDPs in a folding block. There is, however, a practical limitation for this technique. The MSB-2 pattern has approximately eight times higher frequency than the frequency of the input signal, $V_{IN}$. Converting, for instance, a 250 MHz sine wave, gives a 2 GHz signal after analog pre-processing. This factor, eight, is called the "folding rate" of the ADC.

Figure 20:
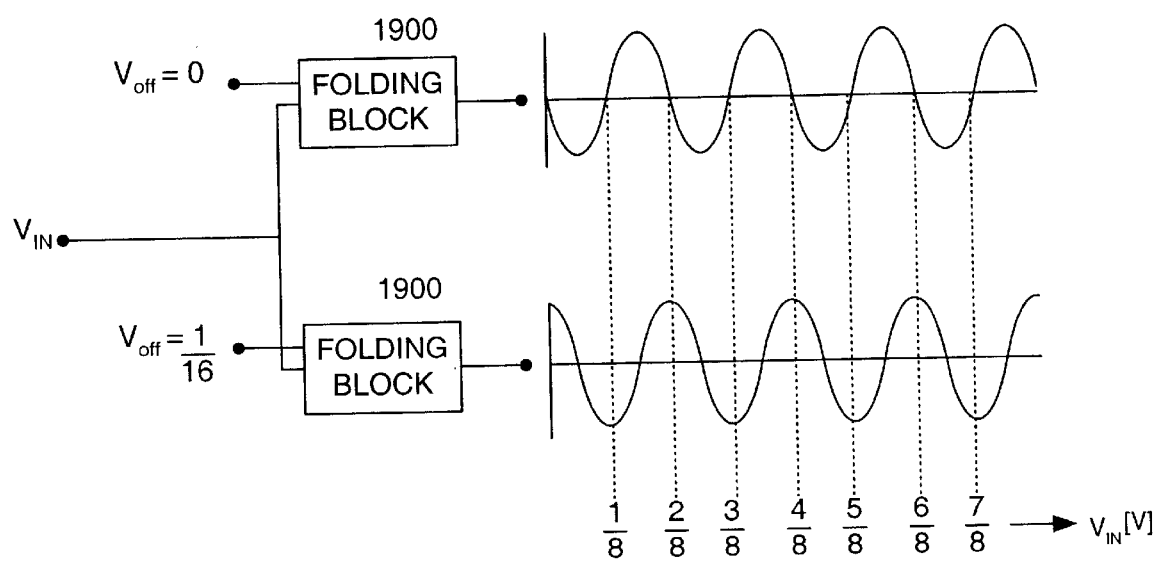
FIG. 20 illustrates the parallel use of the folding bocks.

Techniques such as parallel use of folding blocks have been used to increase the resolution of the ADC, without increasing the folding rate of the system. In FIG. 20, the upper folding block generates a differential signal MSB-2, as explained above. The second folding block has exactly the same analog behavior, but uses reference voltages with an offset of 1/16 V. It is clear that this second folding block defines codes between those of MSB-2. In this way, the resolution is increased by 1 bit and only four folding blocks are used, as it is showed in FIG. 17.

In a folding ADC, the reason of performing a folding operation on signals is to make possible the multiple use of parts of the hardware, such as the comparators, pre-amplifiers and the like. Such a technique has a limitation in accuracy and bandwidth, while a rather large supply voltage is needed in the cases when multiple coupled differential pairs are used. This is because the required reference voltage needs to be able to fold several times and that reference voltage cannot be larger than the supply voltage. Therefore, a large supply voltage is needed to be able to accommodate a multiple folded reference voltage.

The major advantage of folding and interpolation lies in the high sample rate, in combination with low power consumption and small chip area. The folding converter requires little power to drive the input, compared to other converters. The power consumed by the reference ladder of the folding converter is also relatively low. Since ADCs include a comparator to check the polarity of the input signal, the exact shape of the folded signal is not important. What is important is where the zero crossings occur. In the designs previously described, the output signal performs a zero crossing each time the input signal goes below or above one of the reference voltages. The aim of an 8-times folding technique is to pre-process the analog signal so that one comparator is used for 8 different input signal levels instead of only one, like in a full flash architecture. Therefore the coarse part has to consist of 3 bits to decide which of the 8 possibilities is valid.

Figure 21:
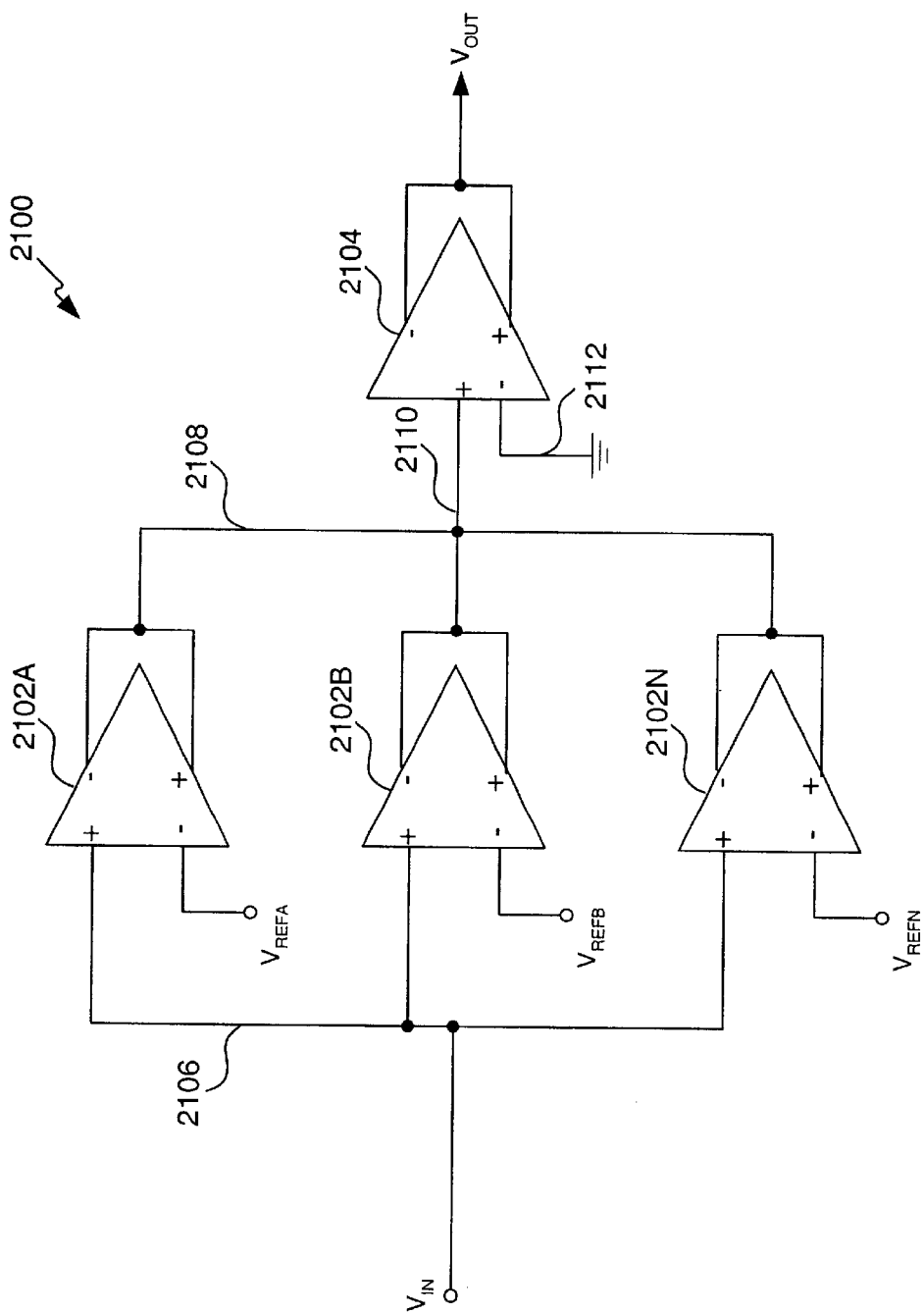
FIG. 21 illustrates a circuit using classic folding.

A classic folding circuit is shown in FIG. 21. The classic folding circuit 2100 comprises a plurality of differential amplifiers 2102A, 2102B through 2102N, another separate differential amplifier 2104, a structure 2106 which allows the first differential inputs of the amplifiers 2102 to be fed with the same voltage $V_{IN}$ and a structure 2108 that connects the differential output off all the N amplifiers into a common line 2110. The second differential input of the 2102 amplifiers is connected to one of a plurality of reference voltages $V_{REFA}$, $V_{REFB}$, through $V_{REFN}$. The values of these reference voltages are different for each of the N differential amplifiers that are included in the 2100 circuit, The first differential output and the second differential output of the 2102 amplifier are connected together in a common point. The first differential input of the 2104 amplifier receives the signal collected in the common line 2110. The second differential input of the 2104 amplifier (2112) is grounded. The 1st and 2nd differential outputs of the 2104 amplifier are coupled together to form an output $V_{OUT}$. The combined 1st and 2nd outputs of the amplifier 2102 are loaded with load resistors (not shown in the figure) as would be apparent to a person skilled in the relevant art. Current sources for the differential amplifiers are also not shown.

In operation, one out of the three input signals is in the linear range, while at the same time, the other two input signals are clamped to a defined positive or negative signal level. The signal being in the linear range is processed by the respective the amplifier 2102. At the output, a folded repetitive signal is obtained. This circuit has several drawbacks. Matching of the output loading resistors and the matching of the current sources is difficult, and unavoidable mis-matches degrades accuracy. Furthermore, a large supply voltage is required. What is needed is a folding circuit, particularly for use in an analog to digital converter that overcomes these drawbacks.

All known folding/interpolating analog-to-digital converters show a few common general features. They contain a structure that presents a flash like architecture, that presents the advantage of an excellent conversion speed and they contain a structure that performs a folding step and an interpolation step. These two steps are usually performed by separate structures, which reduce the number of comparators and pre-amplifiers, thereby reducing chip area and power requirements. The present invention further reduces power consumption and area requirements and zero crossings linearity requirements of the internal blocks are reduced.

A simplified block diagram of a folding/interpolating ADC generally comprises a reference voltage generation block that generates a first reference voltage signal based on an analog input signal, a folding block, an interpolating block, and a comparator/encoder block. The folded signals emerging from two parallel folding blocks would be out of phase with respect to each other and a reference voltage level. Subsequently, the folded signals would cross a reference voltage level at different coordinates. The crossing coordinates are important points because based on their position the folding ratio of the converted signal in an analog-to-digital converter can be determined. In a representation of the folded signal emerging from a structure with multiple parallel folding blocks the emerging signal from the comparator block has more steps, corresponding to a bigger number of zero crossings.

Some of the problems drawbacks of structures like the one presented in FIG. 21 include: require large space on the chip, high power consumption and limited zero-crossing accuracy. One of the advantages of the structures proposed below by the present invention is that the accuracy of the zero-crossing are significantly improved. Pre-amplification structures implemented using CDPs have similar problem: they present erroneous tail currents, and the coordinate of the zero-crossing is different than the ideal zero-crossing point due to mismatches. Pre-amplifiers implemented using CDPs also have non-liniarities, thereby affecting the linearity of the interpolation. Several attempts have been made to improve pre-amplifier accuracy. They include increasing the transistor sizes for better matching and the conclusions reached were that the transistors size is limited by a reasonable transfer speed. Also, calibration of the offsets by performing auto-zero and background calibration. These techniques reduce the available settling time and the power consumption associated. In what the background calibration is concerned, the synchronisation of the calibration and the normal operation are critical. But they are difficult to route. In order to improve the accuracy, lateral resistors are inserted between the outputs of the folders, the outputs being made to depend on each other. The input transistor area has been effectively increased. The present invention proposes replacing the structure presented by FIG. 7, structures which includes the averaging techniques mentioned to improve the accuracy of matching between the ideal zero crossings points and the real zero crossing points.

Figure 22:
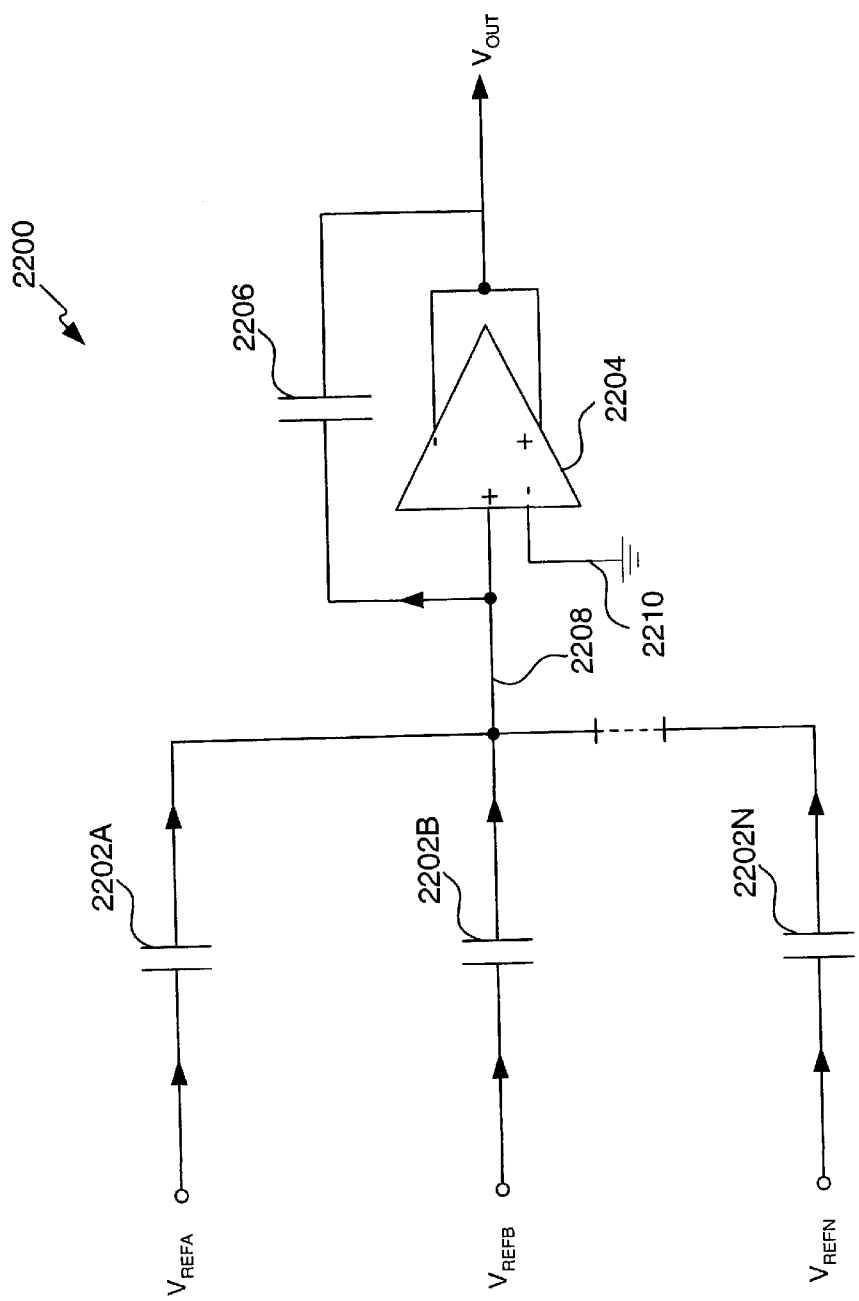
FIG. 22 illustrates a circuit using capacitive folding, according to the present invention.

The structure presented by the present invention is presented in FIG. 22. FIG. 22 is a circuit for capacitive folding, according to one embodiment of the present invention. The circuit includes a plurality of capacitors (shown generally as 2202), of equal size and a optional feedback element (usually a capacitor (2206)) with a capacitance value three times higher that the capacitance value of 2202, to obtain a unitary gain. The capacitive folding circuit 2200 comprises a plurality of capacitors 2202, a differential amplifier 2204 and a feedback element 2206. A first lead of each capacitor 2202A, 2202B through 2202n is coupled to one of a plurality of first reference voltages, shown generally as $V_{REFA}$, $V_{REFB}$ through $V_{REFN}$ capacitors 2202A, B, ..., N each have an equal capacitance value. A second lead of each of the capacitors 2202 is coupled to a 1st differential input of the differential amplifier 2204. A second input of the differential amplifier 2204 is coupled to a 2nd reference voltage accordingly to an exemplary but not imitating embodiment, the second reference voltage is ground (as shown in FIG. 22). A first and second differential output of the differential amplifier 2204 are coupled together to form an output ($V_{OUT}$) of the capacitive folding circuit 2200. The feedback element 2206 is coupled between the 1st differential input on the differential output of the differential amplifier 2204. According to an exemplary but not limiting embodiment of the present invention, the feedback element 2206 is a capacitor having a value equal to n times the value of capacitors 2202. The main advantage of the above described implementation of a is a lower power consumption and smaller requirement for the chip area.

As mentioned above a major drawback of conventional ADCs is that their comparators have offsets, which are usually large compared to the desired values for embedded, high-speed implementations. To reduce this effect pre-amplifiers are typically used to amplify the signal. As a result, relative to the amplified signal, the adverse impact of the comparator-introduced offset is minimized. As also noted above, the use of pre-amplifiers requires added power and chip area resources. In contrast, folding is implemented in the present invention with a plurality of capacitors that consume less power and require less chip area. This inventive capacitive folding circuit/structure can be inserted between different stages of a cascaded comparators, thereby resulting fewer pre-amplifiers and/or comparators.

In a practical ADC, the amplifiers and the comparators are differential and typically a capacitive feedback element is used. The feedback capacitor for the described circuit is part of the common mode feedback circuit. Two of three signals are clamped (high or low) and only one signal is retained in the linear mode to perform the folding operation. Among the advantages this circuitry presents are: small supply voltages, accuracy determined by the matching between the three input capacitors and low power dissipation.

Typically, both the input and the output are differential pairs. In the case of differential inputs, one differential input is usually connected to a reference voltage (or to the ground) and the other differential input is connected to the input signal. In the exemplary circuit of FIG. 21, all of the three amplifiers see the same input signal, but they are connected to different reference voltages, such that the differential input signal is different for each amplifier. For example, when the input signal increases above the lowest reference voltage, then, the particular amplifier with the lowest reference voltage would see a zero crossing earlier than the other ones. Moreover, the polarity of the other two amplifiers is flipped, every time the input signal goes above or below one of the reference voltages. Therefore this circuit is performing three times folding: the output signal goes to a plus, a minus, and a plus.

The three differential folding amplifiers are of equal size and strength and their outputs are inter-connected and thus their outputs are opposing each other. In each case, the two outputs cancel each other and the final output (that constitutes a first output signal and is input to a comparator in this circuit) is equal to the remaining third output and that is where the zero crossing of the output is. As an advantage over the other references this design is not limited to four times blocks and can have any arbitrary number of folds.

The necessary number of folding is equal to the reduction in number of required comparators that is desired. Shorting the outputs of three amplifiers results in lowering the output impedance by a factor of three. Since the gain is a direct function of the output impedance, the gain is also reduced by the same factor. In one embodiment of the present invention, an optional feedback capacitor may be used, with a value three times bigger than each input capacitor is used to obtain unitary gain. This embodiment of the present invention is illustrated in FIG. 23.

Figure 23:
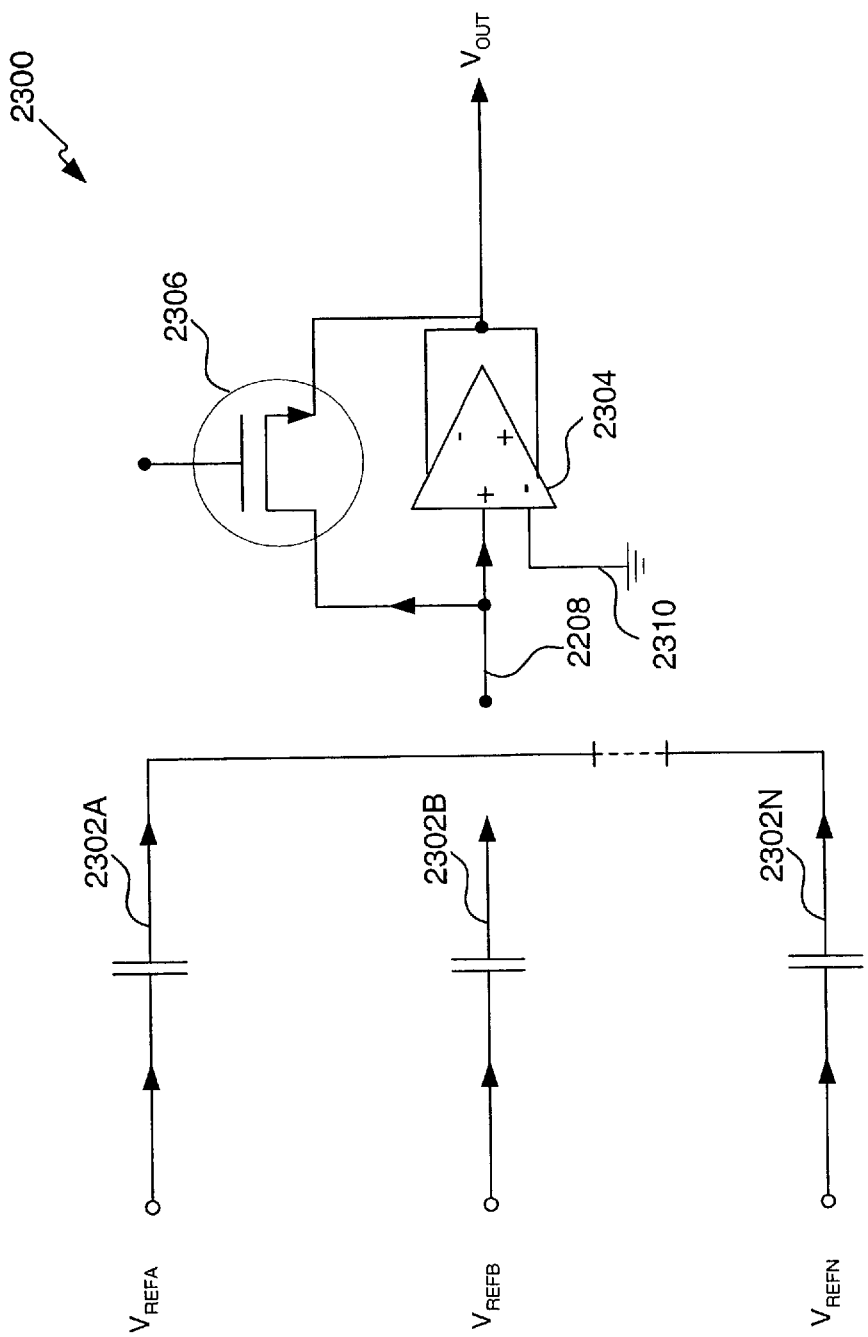
FIG. 23 illustrates a circuit using capacitive folding with switch, according to the present invention.

In FIG. 23, the capacitive folding circuit 2300 comprises a plurality of capacitors 2302, a differential amplifier 2304 and a feedback element 2306. A first lead of each capacitor 2302A, 2302B through 2302N is coupled to one of a plurality of first reference voltages, called generally as $V_{REFA}$, $V_{REFB}$ through $V_{REFN}$. A second lead of each of the capacitors 2302 is coupled to a $1^{st}$ differential input 2308 of the differential amplifier 2304. A second differential input 2310 of differential amplifier 2304 is coupled to a second voltage. Accordingly to an exemplary but not limiting embodiment the $2^{nd}$ reference voltage is grounded (as shown in FIG. 23). A $1^{st}$ and $2^{nd}$ differential output of the differential amplifier 2304 are coupled together to form an output $V_{OUT}$ of the capacitive folding circuit 2300. The feedback element 2306 is coupled between the coupled differential output and the first differential input 2308 of the differential amplifier 2304. According to an exemplary but not limiting embodiment of the present invention the feedback element 2306 is a switch, a dual phase element, that can be switched using two clock phases $\phi_1$ and $\phi_2$.

In one embodiment of the present invention, the folding capacitors are implemented using switch capacitor techniques. In this embodiment, the capacitors are switched using two clock phases ($\phi_1$ and $\phi_2$). As shown in FIG. 23, one input of the amplifier is connected to the virtual ground, at the other input of the amplifier, the output and the input of the amplifier is short circuited by a switch during the re-set phase. The inputs are then connected to the three reference voltages. In the next phase, the short circuit is opened up by opening the switch between input and output of the amplifier. The input signal is then applied to all of the three capacitors.

The three capacitive folding circuits (folding blocks) generate three folding signals. The folding blocks include differential pairs and switched capacitors according to one embodiment of the present invention. Switched capacitors are conventional circuits, having various implementations, as would be apparent to a person skilled in the art. The representation of the differential output current has the same shape as a folding signal, as represented in FIG. 2.

The three folding signals are designed to have different offsets with respect to the input signal. Especially at high frequencies, the peaks of the folding signals are distorted. However, one of the three signals is always in its linear region, around zero crossing. With a larger number of folding signals, instead of three, only the zero crossings themselves would be of interest, and even more distortion in the peaks of the folding signals would be allowed.

Figure 24:
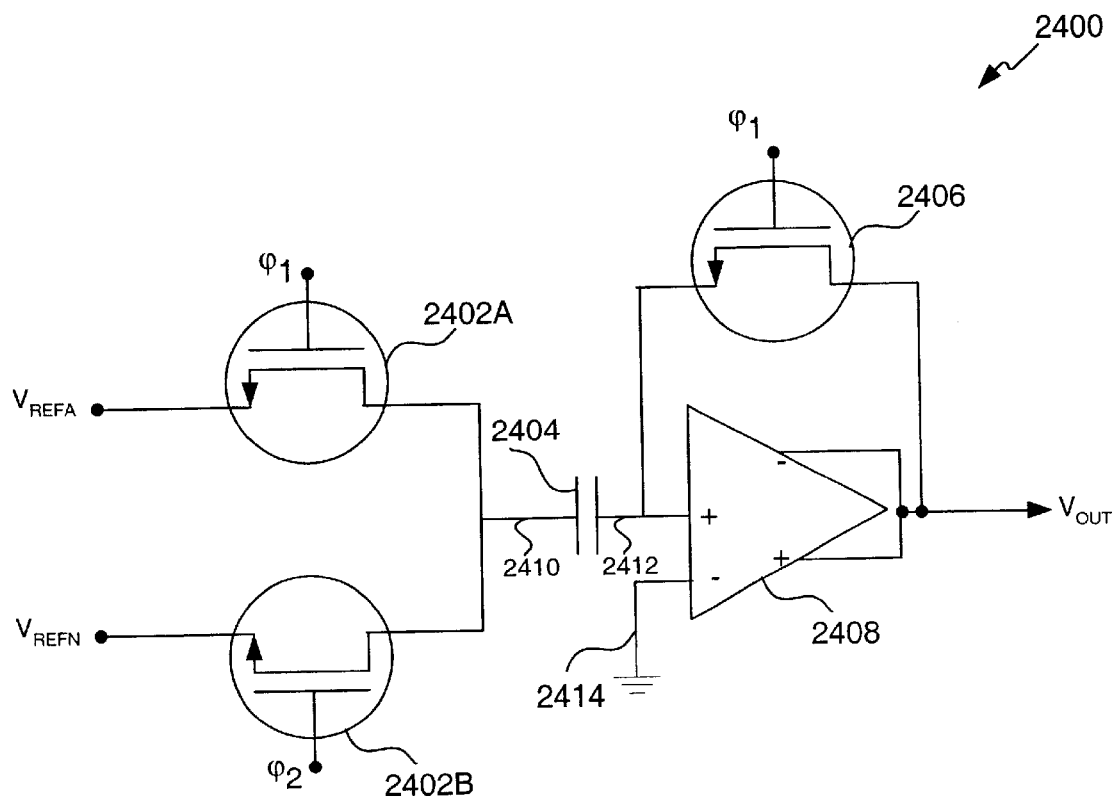
FIG. 24 illustrates a simplified circuit diagram of a capacitive folding, according to the present invention.

FIG. 24 is a simplified circuit diagram of capacitive folding, according another embodiment of the present invention. The capacitive folding circuit (2400) comprises a plurality of switches 2402, a capacitor 2404, a differential amplifier 2408, a feedback element 2406. A first input line of each switch 2402A through 2402N is coupled to one of a plurality of first reference voltages, storen generally as $V_{REFA}$ through $V_{REFN}$. A second input line of each switch 2402 is coupled to a clock phase generating element (not shown in the figure). The input clock phases in the 2402 switches are $\phi_1$ and $\phi_2$. The output lines of the 2402 switches are coupled in a common line 2410. The 2410 line is the first lead of a capacitor 2404. The second lead of the 2404 capacitor is connected to the first differential input of the 2408 differential amplifier. The second differential input 2414 of the 2408 differential amplifier is connected to ground, according to an exemplary but not limiting embodiment of the invention. The 1st and 2nd differential outputs of the 2408 amplifier are connected together to form an output, $V_{OUT}$. The feedback element 2406 is coupled between the 1st differential input and the 2nd differential output of the 2408 differential amplifier. According to an exemplary but not limiting embodiment of the present invention the feedback element 2406 is a dual phase element, such as a switch. The 2406 element receives the same input clock phases ($\phi_1$ and $\phi_2$). The clock phase received by the feedback element 2406 coincides alternatively with the one received by the 2402 switches. It is $\phi_1$ when 2402A receives $\phi_1$. It is $\phi_2$ when 2402B receives $\phi_2$.

The exemplary circuit of FIG. 24 illustrates how the differential inputs are applied to each input capacitor. As shown, during clock phase signal $\phi_1$, $V_{REFA}$ is connected to the input capacitor to charge the capacitor. During clock phase signal $\phi_2$, $V_{REFB}$ is connected to the input capacitor, with the purpose to charge/discharge the capacitor. As a result, the capacitor voltage is equal to the difference of $V_{REFA}$ and $V_{REFB}$. $\phi_1$ and $\phi_2$ are two non-overlapping clock phase signals.

In one embodiment of the present invention, the amplifiers are cascaded.

Figure 25:
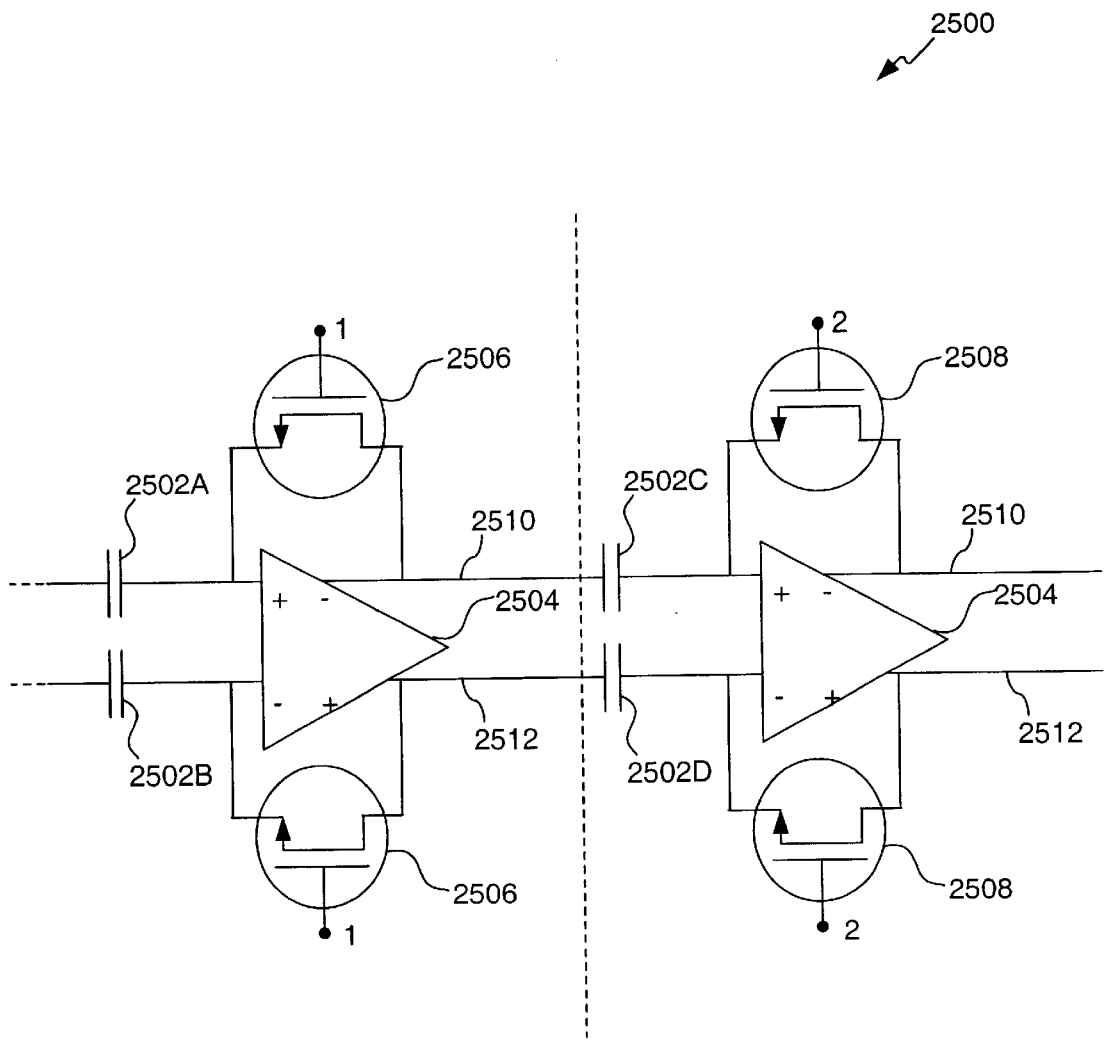
FIG. 25 illustrates an exemplary circuit for cascading two non-folding amplifiers, according to the present invention.

FIG. 25 shows an exemplary circuit for cascading two differential, non-folding amplifiers. 2N identical feedback switch elements have been used, each providing feedback between the negative output and the positive input of the differential amplifiers, respectively, between the positive output and the negative input of the differential amplifier. Each pair corresponding to an differential amplifier receives a corresponding signal, $\phi_1$ and $\phi_2$. The structure further comprises a plurality of equal capacitance capacitors, each being connected on the line that leads to the positive or negative input of the amplifier.

The cascaded exemplary circuit 2500 comprises a N stages cascaded structure, comprises a plurality of capacitors (2502A through 2502X, where X=2N), a plurality of differential amplifiers (2504A through 2504N), a plurality of feedback elements (2506A through 2506X). An upper and lower levels 2500 circuit comprises a first lead of an 2502 upper capacitor is connected into a plurality of reference voltage supplies (not showed in the figure), or to the upper output line 2510 of the cascaded stage. The second lead of the 2502 upper capacitor is connected to the first input of the differential amplifier 2504. An upper feedback element 2506 is connected between the first differential input and the fist differential output of the differential amplifier 2504. According to an exemplary but not limiting embodiment of the invention the feedback elements 2506 are switches. A first lead of a lower 2502 capacitor is connected into a plurality of reference voltage supplies (not showed in the figure) or to the lower output line (2512) of the cascaded stage. An lower feedback element 2506 is connected between the second differential input and the second differential output of the differential amplifier 2504. Both the lower and the upper feedback elements of a cascaded stage receive a clock phase signal characterized by the same clock phase ($\phi_1$). The clock phase received by the upper and lower switches of the next cascaded stage is different from the previous one ($\phi_2$). The two clock phases alternate from one stage of the cascaded circuit to another.

Figure 26:
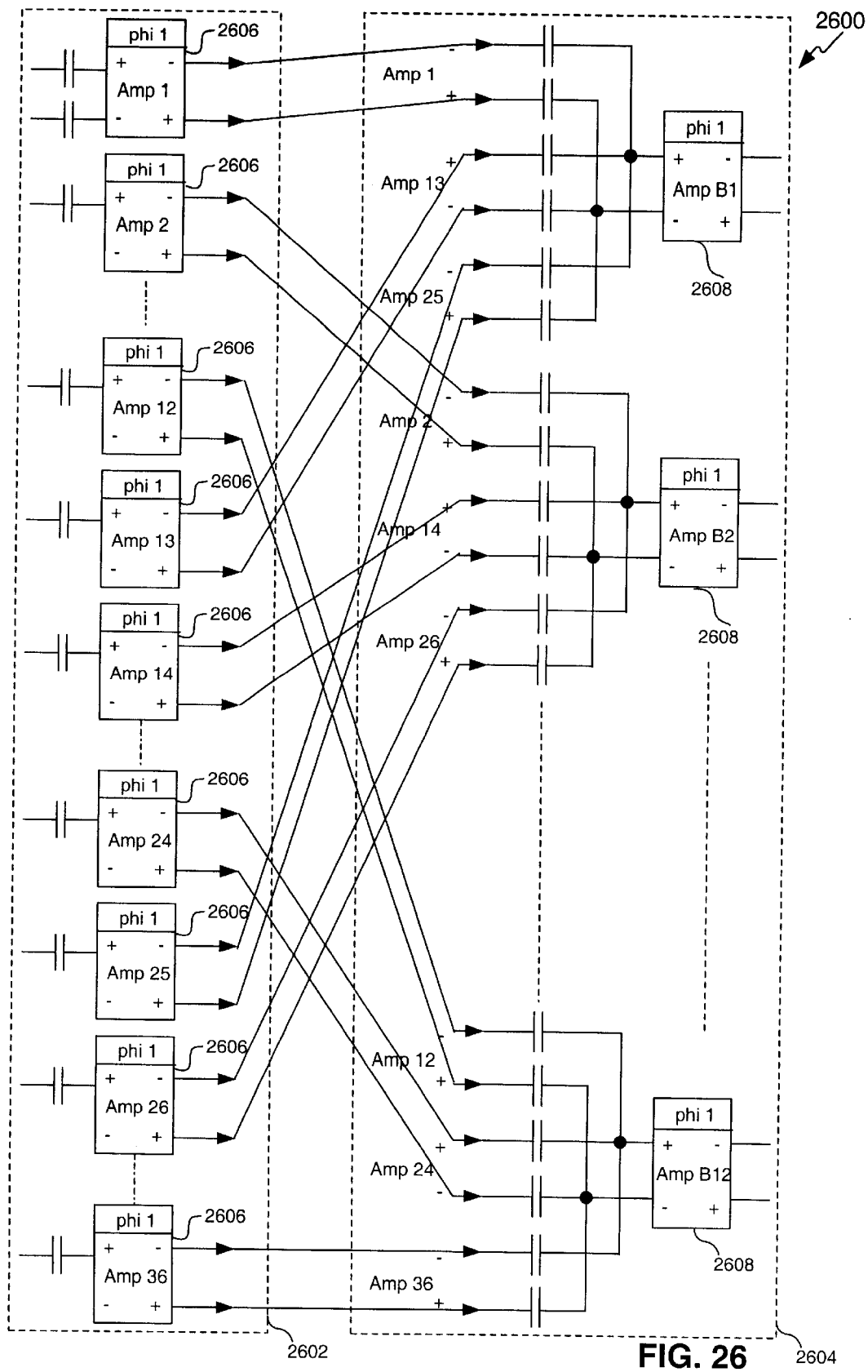
FIG. 26 illustrates an exemplary circuit for cascading thirty six amplifiers, according to the present invention.

FIG. 26 shows an exemplary circuit for cascaded folding. The cascaded folding circuit (2600) comprises a primary cascaded folding structure (2602) and a secondary cascaded folding structure (2604). According to this exemplary but not limiting embodiment of the present invention the primary cascaded folding circuit (2602) comprises a plurality of N cascaded capacitive folding circuits (2606). The capacitive folding circuits may be implemented as the folding circuits in FIGS. 22, 23 and 24. According to this exemplary but not limiting embodiment of the present invention, the secondary cascaded folding circuit 2604 comprises a plurality of N/4 cascaded capacitive folding circuits 2608. The cascaded folding circuit illustrated in FIG. 26 is characterized by N=36.

The primary cascaded folding circuit 2602 and respectively its components, the capacitive folding circuits 2606 receive a plurality of reference voltage signals (not showed in the figure). The emerging folded signal constitutes input signal for a secondary folding structure 2604, comprising N/4 capacitive folding structures 2608. The input reference voltage signal suffers multiple folding.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention.

What is claimed is:

1. An M-bit interpolating, folding analog-to-digital converter (ADC) circuit comprising:
    a reference voltage generator that outputs a plurality of first reference voltage signals;
    a converter having an amplifier, which receives at least one of said plurality of first reference voltage signals and outputs a plurality of coarse bits, and N-number of folding blocks, each folding block comprising:
        a plurality of capacitors, each having a first lead coupled to one of said plurality of first reference voltage signals;
        a differential amplifier having a first differential input coupled to a second lead of each of said plurality of capacitors, a second differential input coupled to a second reference voltage, and first and second differential outputs that output a folded signal, and
        a feedback capacitor having a first feedback lead coupled to at least one of said first and second differential outputs and a second feedback lead coupled to said first differential amplifier input;
    an interpolator that receives each of said folded signals form said N-number of folding blocks and outputs M times N number of interpolated outputs, and
    a comparator that assigns one of a binary 1 and a binary 0 to each of said interpolated outputs, and outputs said binary 1s to said amplifier and said binary 0s as fine bits to an encoder, or outputs said binary 0s to said flash ADC amplifier and said binary 1s as said fine bits to said encoder;
    wherein said encoder receives said course bits and said fine bits and outputs M number of bits, where M equals the sum of said coarse bits and said fine bits.

2. The circuit of claim 1, wherein said plurality of capacitors of said N-number of folding blocks each comprising a switched capacitor.

3. The circuit of claim 1, wherein said plurality of capacitors is X capacitors, each having a capacitance equal to Y, and said feedback element capacitor has a capacitance value equal to X times Y.

4. The circuit of claim 1, wherein said folding block is a primary folding block.

5. The circuit of claim 1, wherein said converter having an amplifier that receives at least one of said plurality of first reference voltage signals and outputs a plurality of coarse bits, further comprises a cascaded folding structure.

6. The circuit of claim 5, wherein said cascaded folding structure comprises at least one of said primary folding blocks that receives at least one of said plurality of first reference voltage signals and outputs a primary folded signal.

* * * * *